(12) United States Patent
Aoki et al.

(10) Patent No.: US 7,969,400 B2
(45) Date of Patent: Jun. 28, 2011

(54) LIQUID CRYSTAL DISPLAY DEVICE WITH DECREASED POWER CONSUMPTION

(75) Inventors: Yoshinori Aoki, Mobara (JP); Mitsuru Goto, Chiba (JP); Shouji Nagao, Chiba (JP); Kouichi Kotera, Kokubunji (JP)

(73) Assignee: Hitachi Displays, Ltd., Chiba (JP)

( * ) Notice: Subject to any disclaimer, the term of this patent is extended or adjusted under 35 U.S.C. 154(b) by 1210 days.

(21) Appl. No.: 11/062,476

(22) Filed: Feb. 22, 2005

(65) Prior Publication Data

US 2005/0185477 A1     Aug. 25, 2005

(30) Foreign Application Priority Data

Feb. 25, 2004   (JP) .................................. 2004-048960

(51) Int. Cl.
*G09G 3/36*       (2006.01)
*G11C 7/22*       (2006.01)
*G11C 8/00*       (2006.01)

(52) U.S. Cl. ................ 345/98; 365/230.05; 365/189.15; 365/189.16

(58) Field of Classification Search .......... 345/690–693, 345/211, 87, 89, 98–100; 365/230.05, 189.15, 365/189.16, 189.19
See application file for complete search history.

(56) References Cited

U.S. PATENT DOCUMENTS

| | | | | |
|---|---|---|---|---|
| 5,517,461 A | * | 5/1996 | Unno et al. | 365/233.1 |
| 5,867,140 A | * | 2/1999 | Rader | 345/90 |
| 6,212,109 B1 | * | 4/2001 | Proebsting | 365/189.16 |
| 6,314,017 B1 | * | 11/2001 | Emori et al. | 365/149 |
| 6,556,162 B2 | * | 4/2003 | Brownlow et al. | 341/145 |
| 6,839,043 B2 | * | 1/2005 | Nakajima | 345/92 |
| 7,038,641 B2 | * | 5/2006 | Hirota et al. | 345/92 |
| 7,327,339 B2 | * | 2/2008 | Akimoto et al. | 345/92 |
| 2001/0052887 A1 | | 12/2001 | Tsutsui et al. | |
| 2004/0066363 A1 | | 4/2004 | Yamano et al. | |

FOREIGN PATENT DOCUMENTS

| | | |
|---|---|---|
| JP | 11-134866 | 10/1997 |
| JP | 2002-084722 | 9/2000 |
| JP | 2002-318566 | 4/2001 |

* cited by examiner

*Primary Examiner* — William L Boddie
(74) *Attorney, Agent, or Firm* — Stites & Harbison, PLLC; Juan Carlos A. Marquez, Esq.

(57) ABSTRACT

A display device includes a drive circuit to which video data is supplied from the outside; video lines to which video signals outputted from the drive circuit are supplied; and pixels to which the video signals are supplied through the video lines. The drive circuit includes a static random access memory which stores the video data in memory cells. The drive circuit is configured to perform writing only on selected memory cells that are connected to shared writing and reading word lines, to drive other memory cells connected to the shared writing and reading word lines and not selected to perform writing to output video data respectively stored therein to a reading data line, and then to rewrite the video data back to the non-selected memory cells, without precharging the memory cells that are connected to shared writing and reading word lines.

19 Claims, 23 Drawing Sheets

FIG. 8 (b)    FIG. 8 (a)
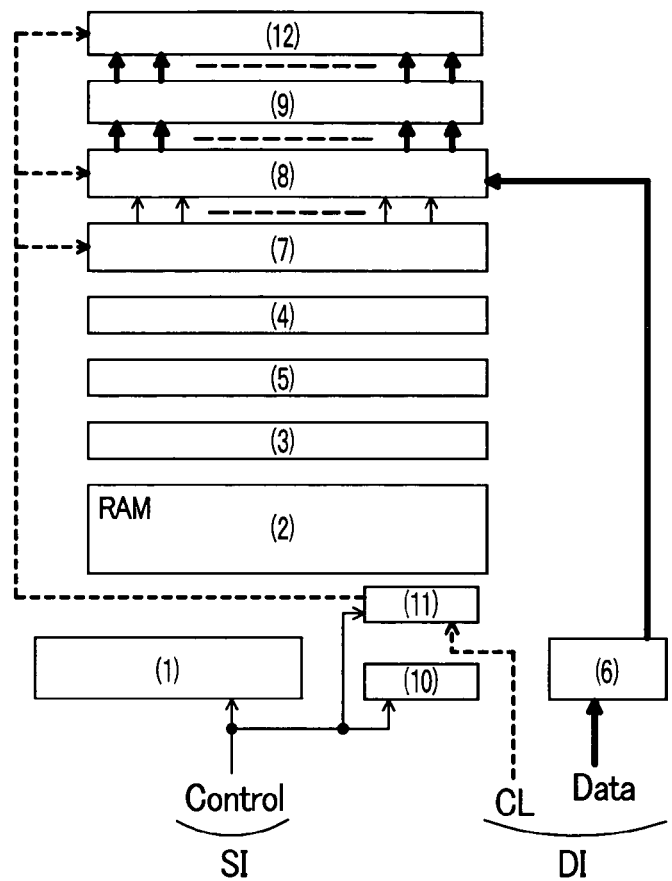
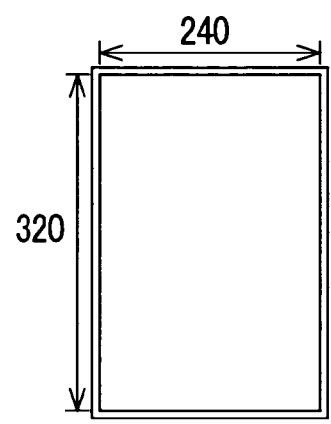
← Display Data
←--- Operation Clock
← Control Signal FIG. 9 (b)  FIG. 9 (a)
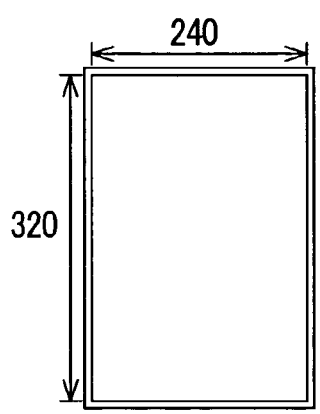
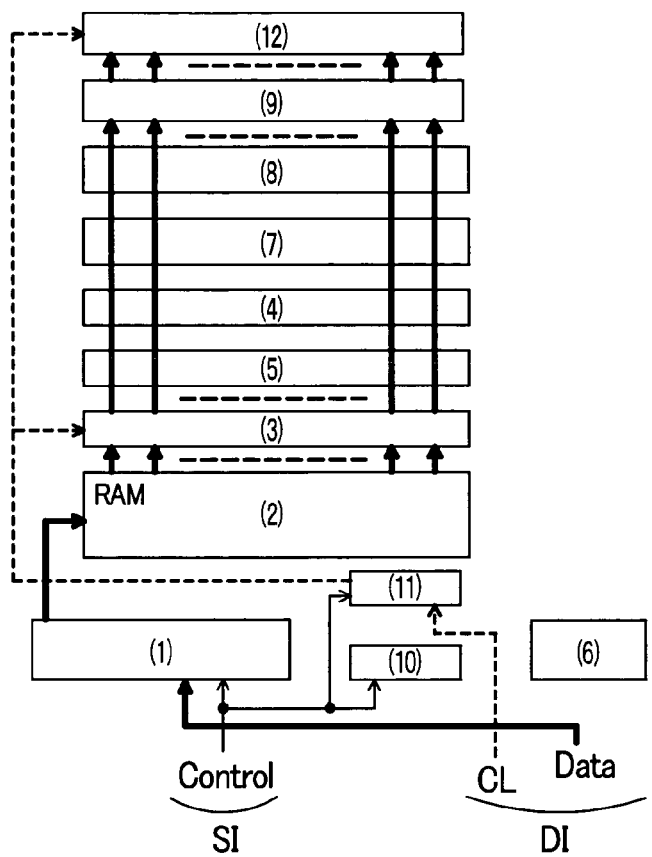
← Display Data
←--- Operation Clock
← Control Signal ← Display Data
←--- Operation Clock
← Control Signal FIG. 14 (b)     FIG. 14 (a)
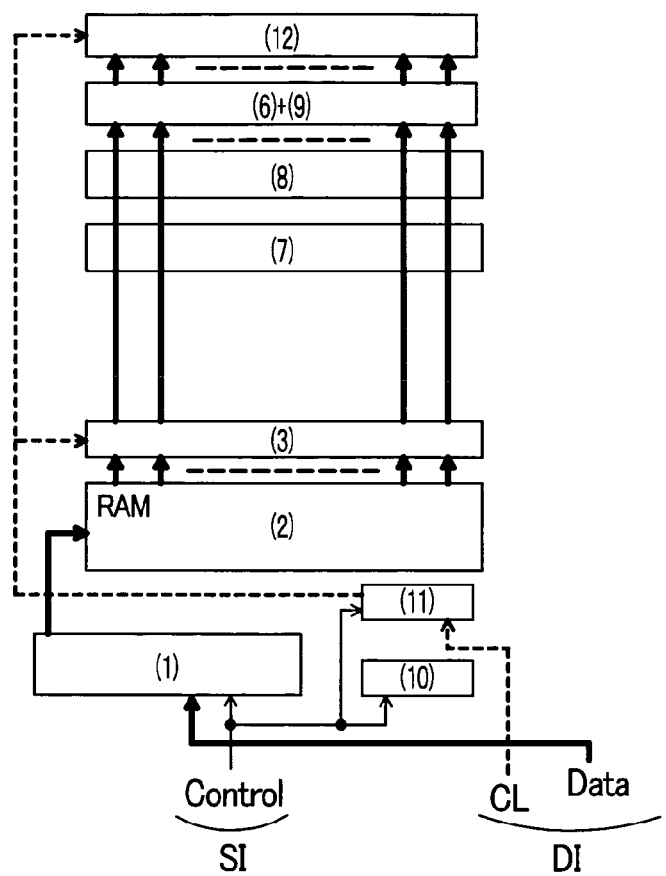
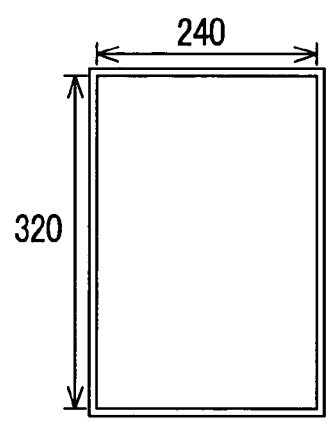
◄——— Display Data
◄--- Operation Clock
◄——— Control Signal

*FIG. 16 (b)*  *FIG. 16 (a)*
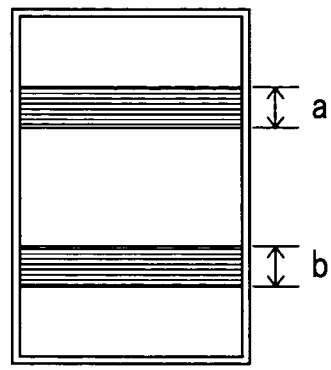
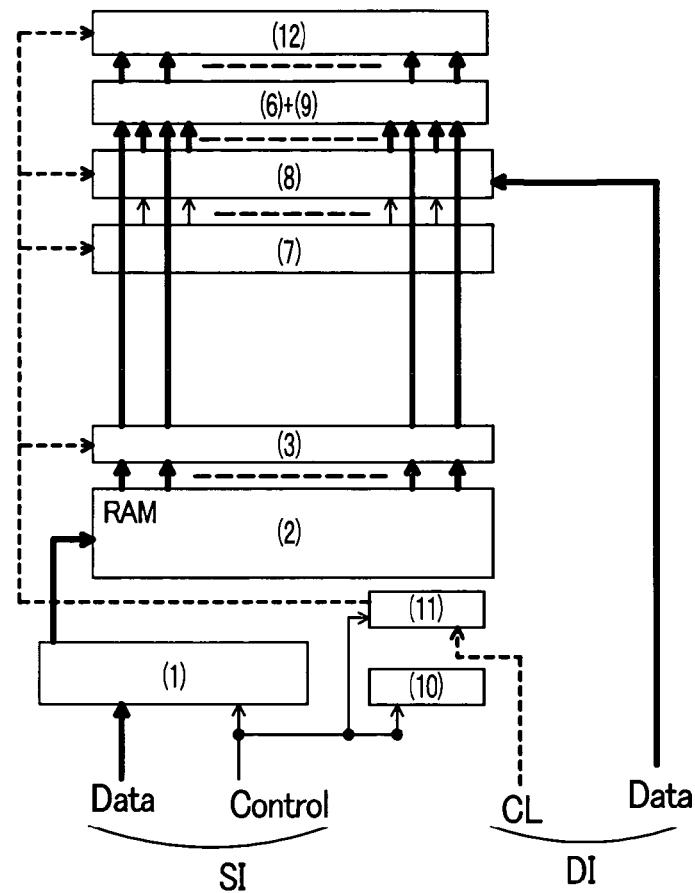

FIG. 21
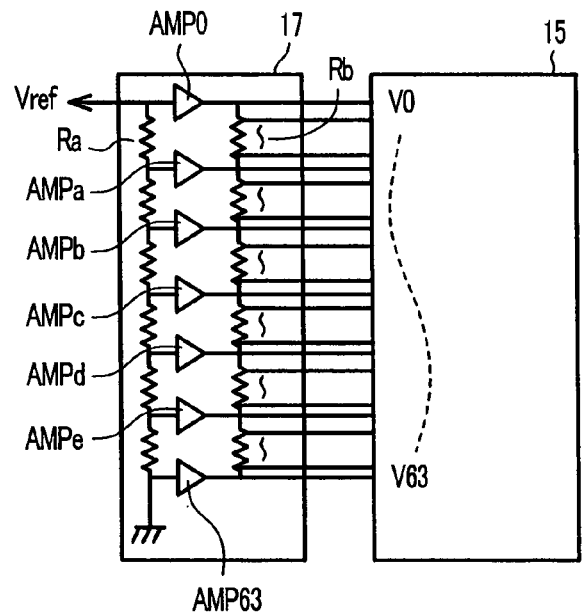
Prior Art  FIG. 22
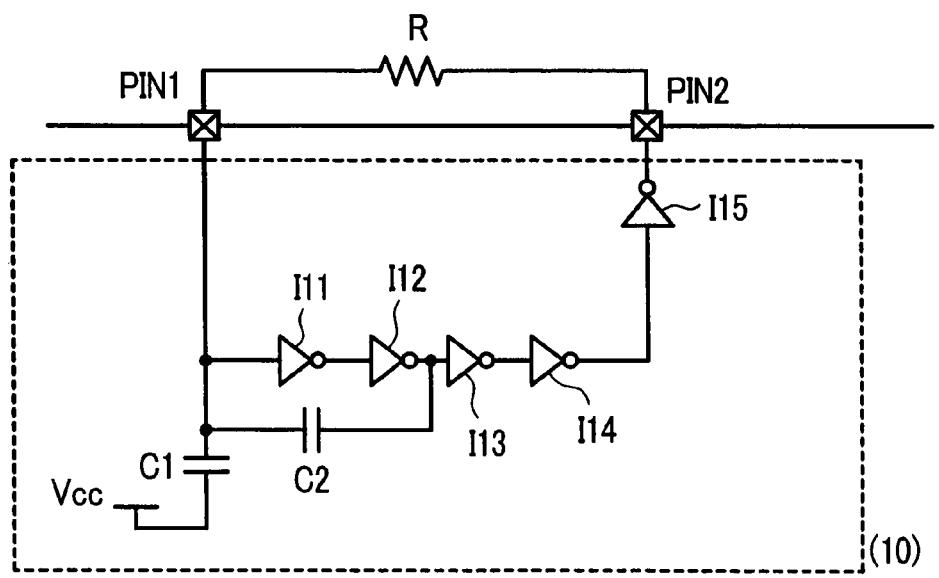

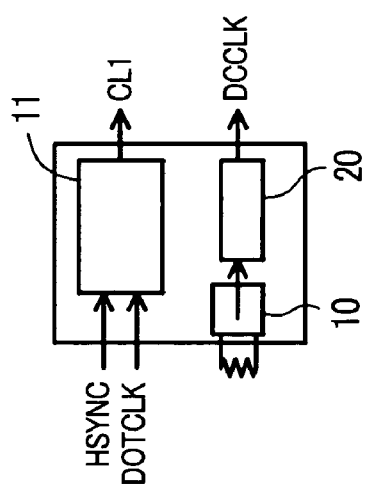
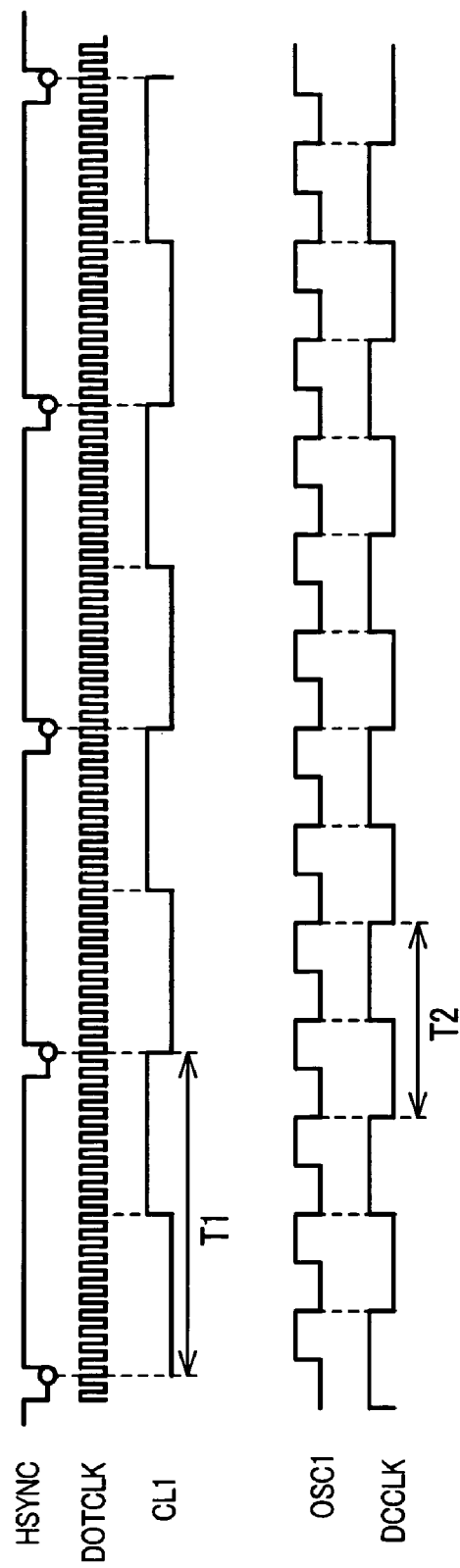
FIG. 25 (a)
FIG. 25 (b)

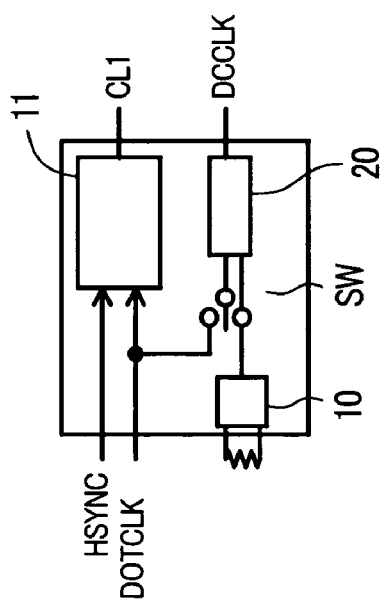
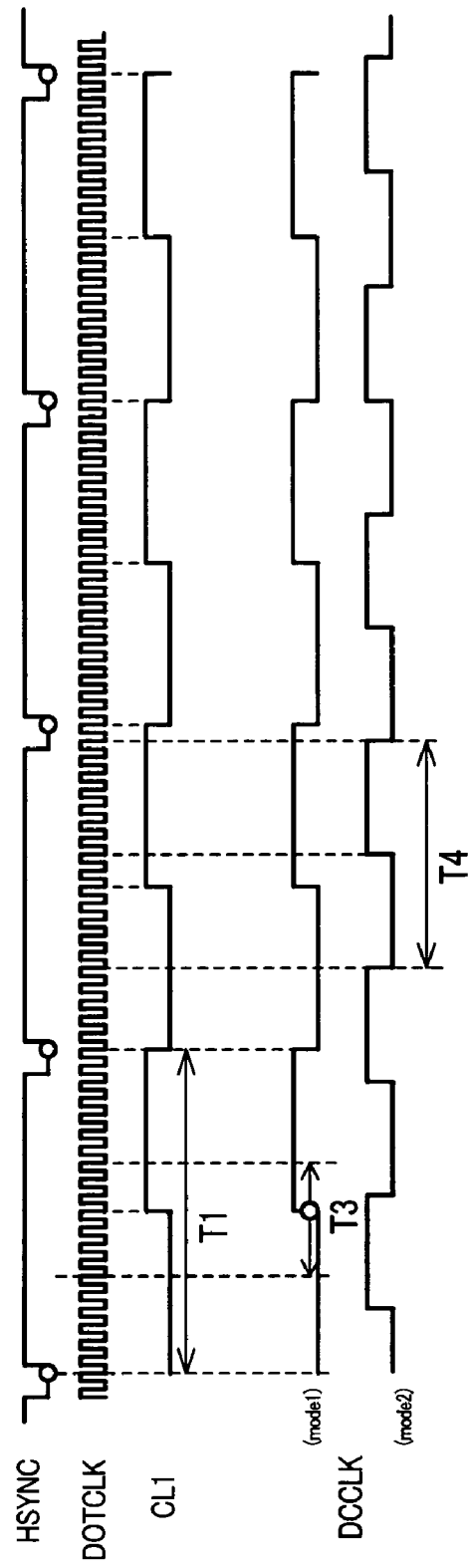

Prior Art  *FIG. 27*
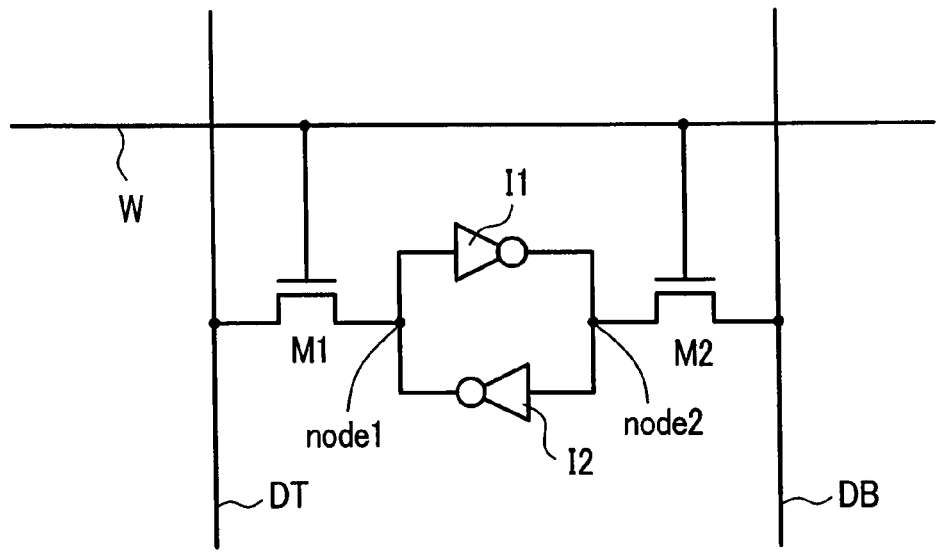
*FIG. 28*
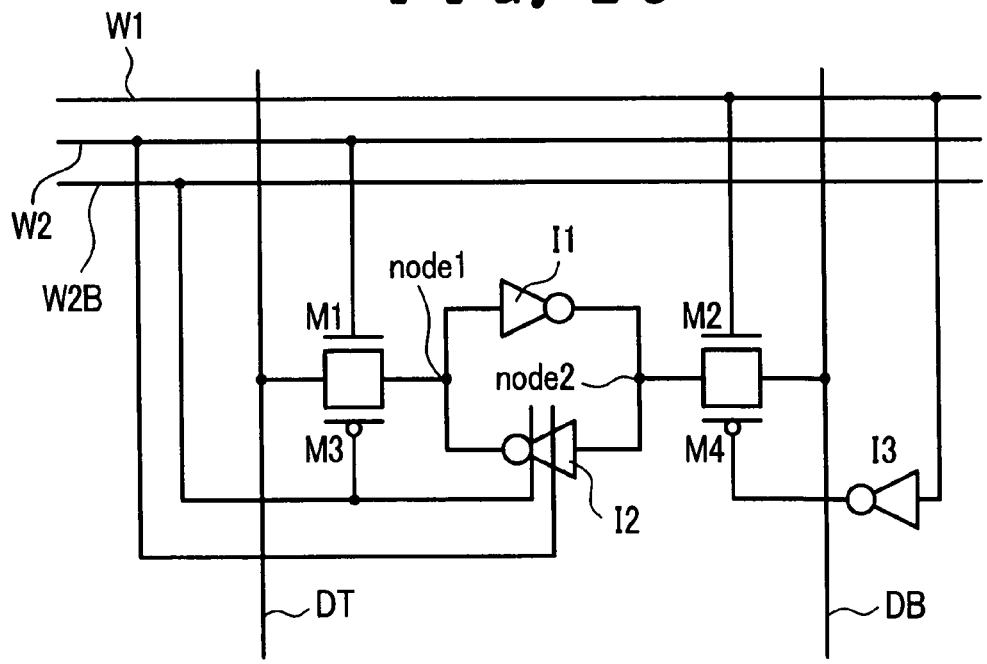

LIQUID CRYSTAL DISPLAY DEVICE WITH DECREASED POWER CONSUMPTION

BACKGROUND OF THE INVENTION

The present invention relates to a display device, and more particularly to a technique which is effectively applicable to a drive circuit of a liquid crystal display device used in a mobile phone or the like.

A TFT-method liquid crystal display module having a small liquid crystal panel with approximately 240×320×3 sub pixels in color display has been popularly used as a display part of a portable digital assistant (PDA) such as a mobile phone.

With respect to the liquid crystal display module which is used as the display part of the mobile phone or the like, to reduce the power consumption, there has been known a liquid crystal display module which includes a semiconductor memory (Static Random Access Memory: hereinafter referred to as SRAM).

FIG. 27 is a circuit diagram showing one memory cell of a conventional SRAM.

As shown in the drawing, one memory cell of the conventional SRAM is constituted of a word line (W), a data line (DT, DB), N-type MOS transistors (hereinafter simply referred to as NMOS) (M1, M2) which constitute transfer switching elements, and inverters (I1, I2).

In FIG. 27, node1 and node2 express internal nodes.

Further, sizes of the respective NMOS (M1, M2) are adjusted such that when a level value between the data line DT which is connected with the NMOS (M1) and the inner node (node1) and a level value between the data line DB which is connected with the NMOS (M2) and the inner node (node2) differ from each other, the node on a High-level (hereinafter called H-level) side node is changed to a Low-level (hereinafter called L-level).

That is, since the writing/reading of the L level is possible, the manner of operation of the SRAM cell shown in FIG. 27 is described as follows.

(1) Writing Operation

Before setting the word line W to the H level, the precharging is performed so as to make the data lines (DT, DB) assume a power-source voltage Vcc temporarily.

Next, the word line W is set to the H-level to turn on the NMOS (M1, M2). At this point of time, since the data lines (DT, DB) assume the H-level, the values of the internal nodes are not changed and the data of a RAM is held.

Next, only the data line of the SRAM by which the writing is performed is changed. For example, in case of writing "0", by setting the data line (DT) to the L-level, the internal node (node1) surely assumes the L level and "0" is written.

On the other hand, in case of writing "1", only the data line (DB) is set to an L-level after precharging. Then, the internal node (node2) surely assumes the L level and the internal node (node1) assumes the H-level due to an inverter (I2). "1" is written in the SRAM.

(2) Reading Operation

Before setting the word line W to the H level, the precharging is performed so as to make the data lines (DT, DB) assume a power-source voltage Vcc temporarily.

Next, the word line W is set to the H-level to turn on the NMOS (M1, M2). Then, when the data stored in a memory cell is "0", since the internal node (node1) is at the L-level, only the data line (DT) is changed to the L-level.

On the other hand, when the data stored in a memory cell is "1", since the internal node (node2) is at the L-level, only the data line (DB) is changed to the L-level. Accordingly, the reading operation of the data of the SRAM is performed.

It is needless to say that, to perform the above-mentioned operations, sizes of transistors in the inside of the respective inverters are adjusted.

As the related art literatures relevant to the present invention, U.S. 2004/066363A1 (literature 1), U.S. 2001/0052887A1 (literature 2), Japanese Patent Laid-open No. 318566/2002 (literature 3), Japanese Patent Laid-open No. 84722/2003 (literature 4) and Japanese Patent Laid-open No. Hei11/134866 (literature 5) are named.

BRIEF SUMMARY OF THE INVENTION

In the memory cell of the above-mentioned SRAM, assuming that the word line is at the H-level and the NMOS (M1, M2) are turned on, when the values of data (DT, DB) are both assume the L-level, the values of the internal inverters (I1, I2) are not determined and hence, there arises a possibility that a penetrating current flows.

Accordingly, in performing the writing/reading operations, it is necessary to surely precharge the data lines (DT, DB) to the power source voltage Vcc.

According, an extra electric power becomes necessary for precharging and this constitutes one of factors which impede the further reduction of the power consumption of the liquid crystal display module having the above-mentioned conventional SRAM. Particularly, when portable equipment which incorporates the liquid crystal display module therein is drive by a battery, the precharging has been a large drawback to overcome for prolonging the lifetime of the portable equipment.

Here, to make the precharging unnecessary, it is necessary to provide the constitution which can realize the writing/reading at the H-level/L-level.

However, the realization of writing at the H-level/L-level implies that when the NMOS (M1, M2) are turned on, the internal nodes are surely changed following the values of the data lines, while the realization of reading at the H-level/L-level implies that when the NMOS (M1, M2) are turned on, the data lines are surely changed following the values of the internal nodes.

Accordingly, it is impossible to perform the writing/reading at the H-level/L-level on both of the data line DT side and the data line DB side.

The present invention has been made to overcome the above-mentioned drawbacks of the related art and it is an object of the present invention to provide a technique which can further realize the low power consumption in a display device including a SRAM.

The above-mentioned object and other objects of the present invention and novel features will become apparent based on the description of this specification and attached drawings.

According to one aspect of the present invention, there is provided a display device which includes a drive circuit to which video data is supplied from the outside, video lines to which video signals outputted from the drive circuit are supplied, and pixels to which the video signals are supplied through the video lines, wherein the drive circuit includes a memory which stores the video data in memory cells, and each memory cell of the memory includes a first inverter which has an input terminal thereof connected to a first node and an output terminal thereof connected to a second node, a second inverter which has an output terminal thereof connected to the first node and an input terminal thereof connected to the second node, a first-conductive-type first transistor which is connected between a first data line and the first node and has a control terminal thereof connected to a first word line, a second-conductive-type second transistor which is connected between the first data line and the first node and has a control terminal thereof connected to a third word line, a first-conductive-type third transistor which is connected between a second data line and the second node and has a control terminal thereof connected to a second word line, and a second-conductive-type fourth transistor which is connected between the second data line and the second node and has a control terminal thereof connected to the fourth word line.

Here, the circuit constitution of one example of this aspect of the present invention is shown in FIG. 5.

According to another aspect of the present invention, there is provided a display device which includes a drive circuit to which video data is supplied from the outside, video lines to which video signals outputted from the drive circuit are supplied, and pixels to which the video signals are supplied through the video lines, wherein the drive circuit includes a memory which stores the video data in memory cells, and a DA converter circuit which is provided between the memory and the video lines, and each memory cell of the memory includes a first inverter which has an input terminal thereof connected to a first node and an output terminal thereof connected to a second node, a second inverter which has an output terminal thereof connected to the first node and an input terminal thereof connected to the second node, a first-conductive-type first transistor and a second-conductive-type second transistor which are connected between a first data line and the first node, and a first-conductive-type third transistor and a second-conductive-type fourth transistor which are connected between the second data line and the second node, wherein the first and the second transistors are turned on at the time of writing the video data and are turned off at the time of reading the video data, and the third and the fourth transistors are turned off at the time of writing the video data and are turned on at the time of reading the video data.

According to still another aspect of the present invention, there is provided a display device which includes a drive circuit to which video data is supplied from the outside, video lines to which video signals outputted from the drive circuit are supplied, and pixels to which the video signals are supplied through the video lines, wherein the drive circuit includes a memory which stores the video data in memory cells, and each memory cell of the memory includes a first inverter which has an input terminal thereof connected to a first node and an output terminal thereof connected to a second node, a second inverter which has an output terminal thereof connected to the first node and an input terminal thereof connected to the second node, a first-conductive-type first transistor which is connected between a first data line and the first node and has a control terminal thereof connected to a first word line, a third inverter which has an input terminal thereof connected to the first word line, a second-conductive-type second transistor which is connected between the first data line and the first node and has a control terminal thereof connected to an output terminal of the third inverter, a first-conductive-type third transistor which is connected between a second data line and the second node and has a control terminal thereof connected to a second word line, a fourth inverter which has an input terminal thereof connected to the second word line, and a second-conductive-type fourth transistor which is connected between the second data line and the second node and has a control terminal thereof connected to an output terminal of the fourth inverter.

Here, the circuit constitution of one example of this aspect of the present invention is shown in FIG. 2.

According to still another aspect of the present invention, there is provided a display device which includes a drive circuit to which video data is supplied from the outside, video lines to which video signals outputted from the drive circuit are supplied, and pixels to which the video signals are supplied through the video lines, wherein the drive circuit includes a memory which stores the video data in memory cells, and each memory cell of the memory includes a first inverter which has an input terminal thereof connected to a first node and an output terminal thereof connected to a second node, a second inverter which has an output terminal thereof connected to the first node and an input terminal thereof connected to the second node, a first-conductive-type first transistor which is connected between a first data line and the first node and has a control terminal thereof connected to a first word line, a second-conductive-type second transistor which is connected between the first data line and the first node and has a control terminal thereof connected to a third word line, a first-conductive-type third transistor which is connected between a second data line and the second node and has a control terminal thereof connected to a second word line, a third inverter which has an input terminal thereof connected to the second word line, and a second-conductive-type fourth transistor which is connected between the second data line and the second node and has a control terminal thereof connected to an output terminal of the third inverter.

Here, the circuit constitution of one example of this aspect of the present invention is shown in FIG. 28.

According to still another aspect of the present invention, there is provided a display device which includes a drive circuit to which video data is supplied from the outside, video lines to which video signals outputted from the drive circuit are supplied, and pixels to which the video signals are supplied through the video lines, wherein the drive circuit includes a memory which stores the video data in memory cells, and each memory cell of the memory includes a first inverter which has an input terminal thereof connected to a first node and an output terminal thereof connected to a second node, a second inverter which has an output terminal thereof connected to the first node and an input terminal thereof connected to the second node, a first-conductive-type first transistor which is connected between a first data line and the first node and has a control terminal thereof connected to a first word line, a third inverter which has an input terminal thereof connected to the first word line, a second-conductive-type second transistor which is connected between the first data line and the first node and has a control terminal thereof connected to an output terminal of the third inverter, a first-conductive-type third transistor which is connected between a second data line and the second node and has a control terminal thereof connected to a second word line, and a second-conductive-type fourth transistor which is connected between the second data line and the second node and has a control terminal thereof connected to a third word line.

Here, the circuit constitution of one example of this aspect of the present invention is shown in FIG. 4.

BRIEF DESCRIPTION OF THE SEVERAL VIEWS OF THE DRAWING

FIG. 5A is a circuit diagram showing one embodiment of a more specific circuit constitution of one memory cell shown in FIG. 3;

FIG. 5B is a circuit diagram showing another embodiment of a more specific circuit constitution of one memory cell shown in FIG. 3;

FIG. 8 is a view showing a flow of image data and a display image of a liquid crystal panel in a mode A in the constitution shown in FIG. 7;

FIG. 9 is a view showing a flow of image data and a display image of a liquid crystal panel in a mode B in the constitution shown in FIG. 7;

FIG. 14 is a view showing a flow of image data and a display image of a liquid crystal panel in a mode B in the constitution shown in FIG. 12;

FIG. 16 is a view showing a flow of image data and a display image of a liquid crystal panel in a mode D in the constitution shown in FIG. 12;

FIG. 21 is a view showing one example of a gray scale voltage generating circuit shown in FIG. 12;

FIG. 22 is a circuit diagram showing a conventional oscillator;

FIG. 25 is a view for explaining a display timing clock (CL1) which is generated by a display timing generating circuit and a voltage boosting clock generated by the oscillator in this embodiment of the present invention;

FIG. 26 is a view for explaining a display timing clock (CL1) which is generated by a display timing generating circuit and a voltage boosting clock generated by the oscillator in a modification of this embodiment of the present invention;

FIG. 27 is a circuit diagram showing one memory cell of a conventional SRAM; and FIG. 28 is a circuit diagram showing one memory cell of a modification of the RAM of the embodiment of the present invention.

DETAILED DESCRIPTION OF THE INVENTION

Hereinafter, embodiments of a display device according to the present invention are explained in conjunction with drawings.

Here, in all drawings served for explaining the embodiments, parts having the identical functions are ideated by same symbols and their repeated explanation is omitted.

Embodiment 1

Figure 1:
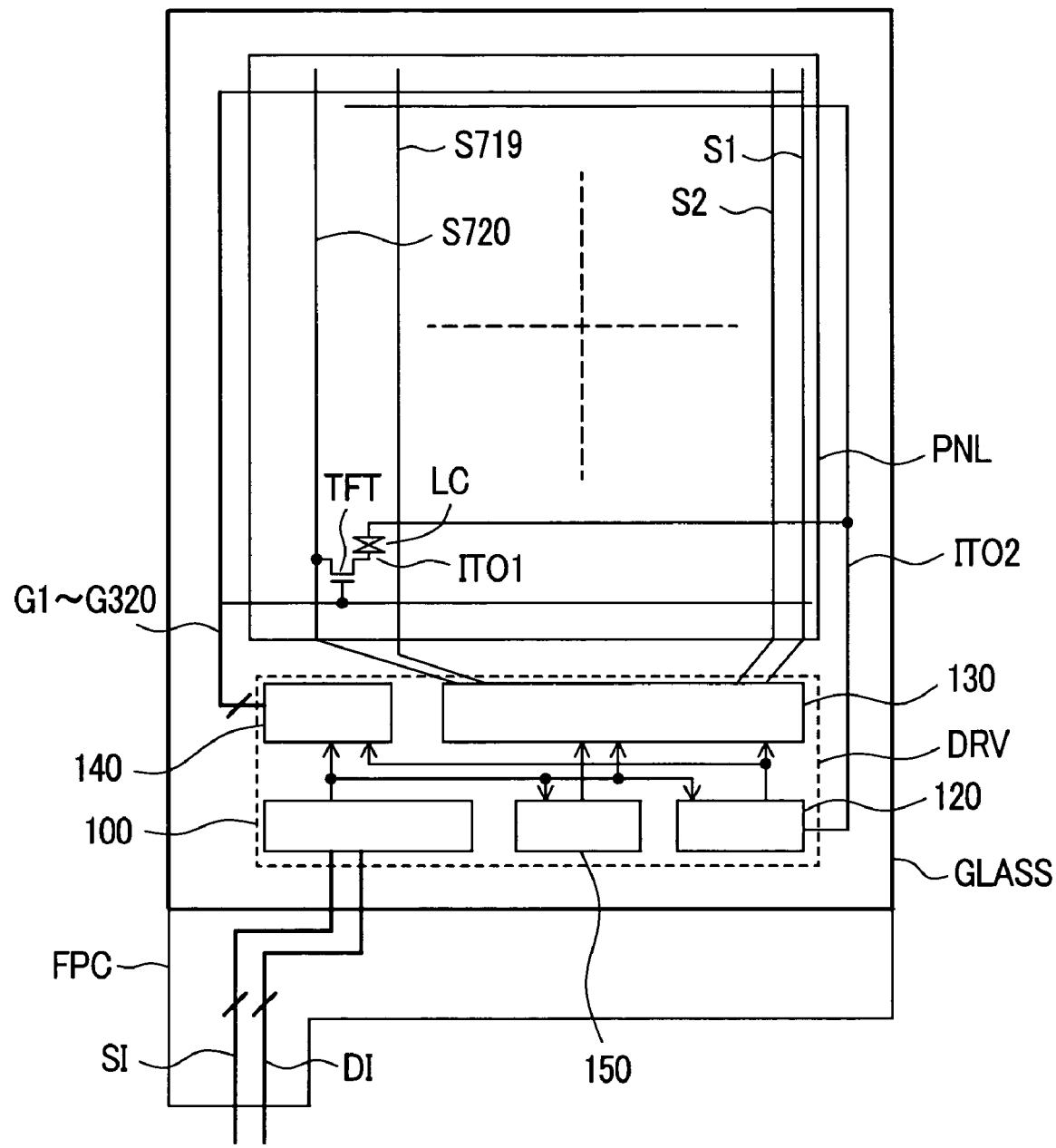
FIG. 1 is a block diagram showing the schematic constitution of a liquid crystal display module of an embodiment of the present invention.

FIG. 1 is a block diagram showing the schematic constitution of a liquid crystal display module of the embodiment 1 of the present invention.

On a liquid crystal panel (PNL), a plurality of scanning lines (or gate lines) (G1-G320) and a plurality of video lines (or drain lines) (S1 to S720) are respectively arranged in parallel.

Pixel portions are formed corresponding to portions where the scanning lines (G) and the video lines (S) cross each other. A plurality of pixel portions are arranged in a matrix array, wherein each pixel portion is provided with a pixel electrode (ITO1) and a thin film transistor (TFT). In FIG. 1, the number of sub pixels of the liquid crystal panel (PNL) is 240×320×3.

A common electrode (also referred to as a counter electrode) (ITO2) is formed in a state that the common electrode (ITO2) faces the respective pixel electrodes (ITO1) in an opposed manner with liquid crystal therebetween. Accordingly, liquid crystal capacitances (LC) are formed between the respective pixel electrodes (ITO1) and the common electrode (ITO2).

The liquid crystal panel (PNL) is configured such that a glass substrate (GLASS) on which the pixel electrodes (ITO), the thin film transistors (TFT) and the like are formed and a glass substrate (not shown in the drawing) on which color filters and the like are formed are overlapped to each other with a given distance therebetween, both substrates are laminated to each other using a sealing material which is formed in a frame shape in the vicinities of peripheries of the substrates, liquid crystal is filled between both substrates and inside the sealing material through a liquid crystal filling opening formed in a portion of the sealing material, and polarizers are laminated to outsides of both substrates.

Here, since the present invention is not relevant to the inner structure of the liquid crystal panel, the detailed explanation of the inner structure of the liquid crystal panel is omitted. Further, the present invention is applicable to a liquid crystal panel having any structure.

In this embodiment, a drive circuit (DRV) is mounted on the glass substrate (GLASS).

The drive circuit (DRV) includes a controller circuit 100, a source driver 130 which drives video lines (S) of the liquid crystal panel (PNL), a gate driver 140 which drives the scanning lines (G) of the liquid crystal panel (PNL), a liquid crystal drive powers source generating circuit 120 which generates a power source voltage necessary for allowing the liquid crystal panel (PNL) to display an image (for example, common voltage (Vcom) which is supplied to the common electrode (ITO2) of the liquid crystal panel (PNL)), and a memory circuit (also referred to as RAM) 150. Further, in FIG. 1, FPC indicates a flexible printed circuit board.

Here, FIG. 1 shows a case in which the drive circuit (DRV) is constituted of one semiconductor chip. However, the drive circuit (DRV) may be directly formed on the glass substrate (GLASS) using a thin film transistor which uses low-temperature poly-silicon as a material of a semiconductor layer, for example.

In the same manner, a partial circuit of the drive circuit (DRV) may be divided so as to form the drive circuit (DRV) using a plurality of semiconductor chips or a partial circuit of the drive circuit (DRV) may be directly formed on the glass substrate (GLASS) using a thin film transistor which uses low-temperature poly-silicon as a material of a semiconductor layer, for example.

Further, in place of mounting the drive circuit (DRV) or a portion of the drive circuit (DRV) on the glass substrate (GLASS), the drive circuit (DRV) or a portion of the drive circuit (DRV) may be formed on the flexible printed circuit board.

Further, to the controller circuit 100, display data and display control signals are inputted from a body-side micro controller unit (hereinafter referred to as MCU) or a graphic controller.

In FIG. 1, symbol SI indicates a system interface which constitutes a system to which various control signals and image data are inputted from the MCU or the like.

Symbol DI indicates a display data interface (an RGB interface) which constitutes a system to which the image data formed by the external graphic controller and a clock for fetching data (external data) are continuously inputted.

In this display data interface (DI), the image data is sequentially fetched in conformity with the fetching clock in the same manner as the drain driver which is used in a conventional personal computer.

The controller circuit 100 transmits the image data received from the system interface (SI) and the display data interface (DI) to the source driver 130 and the RAM 150 so as to control the display.

Figure 2:
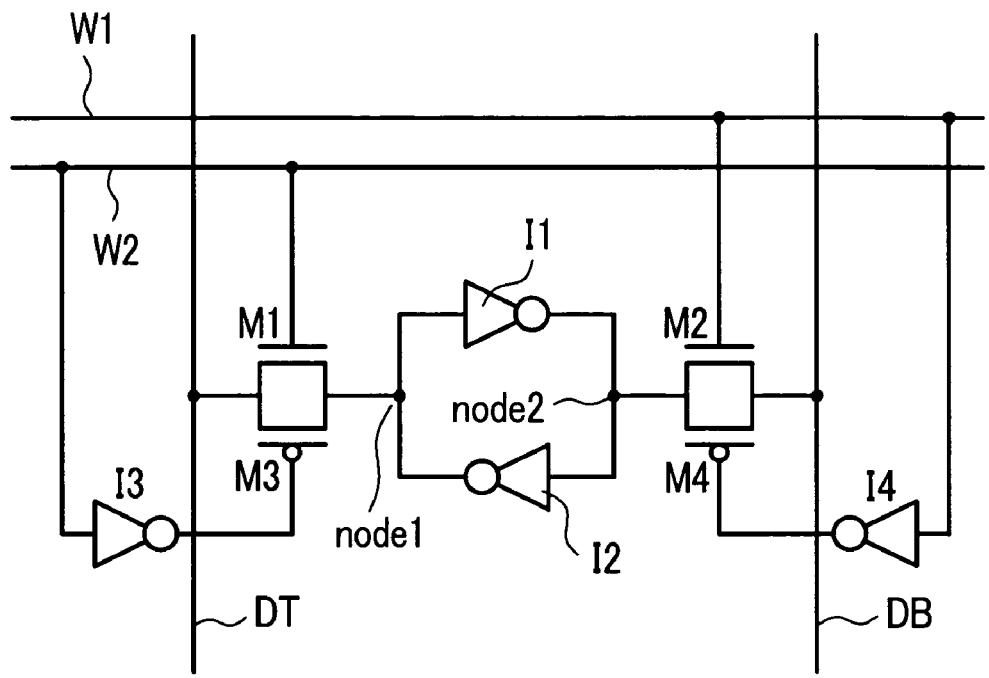
FIG. 2 is a circuit diagram showing one memory cell of a RAM of the embodiment of the present invention.

FIG. 2 is a circuit diagram showing one memory pixel of the SRAM in the inside of the RAM 150 of this embodiment.

In the RAM of this embodiment, to separate the writing of data and the reading of data, word lines are separated into the word line (W2) for writing and the word line (W1) for reading.

Accordingly, the data line (DT) constitutes a writing dedicated data line and the data line (DB) constitutes a reading dedicated data line.

Further, a transfer switching element is constituted of a NMOS transistor (hereinafter, simply referred to as NMOS) (M1) and a P-type MOS transistor (hereinafter, simply referred to as PMOS) (M3) as well as a NMOS (M2) and a PMOS (M4).

Here, an inverter (I3) is provided between a gate of the PMOS (M3) and the word line (W2). In the same manner, an inverter (I4) is provided between a gate of the PMOS (M4) and the word line (W1).

In the SRM of this embodiment, the precharging of the data lines becomes unnecessary.

Hereinafter, the writing/reading operation of the SRAM of this embodiment is explained.

(1) Writing Operation

While setting the word line (W2) to the H-level and by turning on the NMOS1 (M1) and the PMOS (M3), the data line (DT) is changed. For example, in case of writing "0", the data line (DT) is set to assume the L-level. Then, the inner node (node1) surely assumes the L-level and "0" is written in the memory cell.

As an opposite case, in case of writing "1", the data line (DT) is set to assume the H-level. Then, the inner node (node1) surely assumes the H-level and "1" is written in the memory cell.

(1) Reading Operation

The word line (W1) is set to the H-level and the NMOS1 (M2) and the PMOS (M4) are turned on. Then, when the data of the memory cell is "0", the inner node (node1) assumes the H-level and hence, the data line (DB) is changed to the H-level.

As an opposite case, when the data of the memory cell is "1", the inner node (node2) assumes the L-level and hence, the data (DB) is changed to the L-level. Accordingly, it is possible to perform the reading of data of the SRAM.

Figure 4:
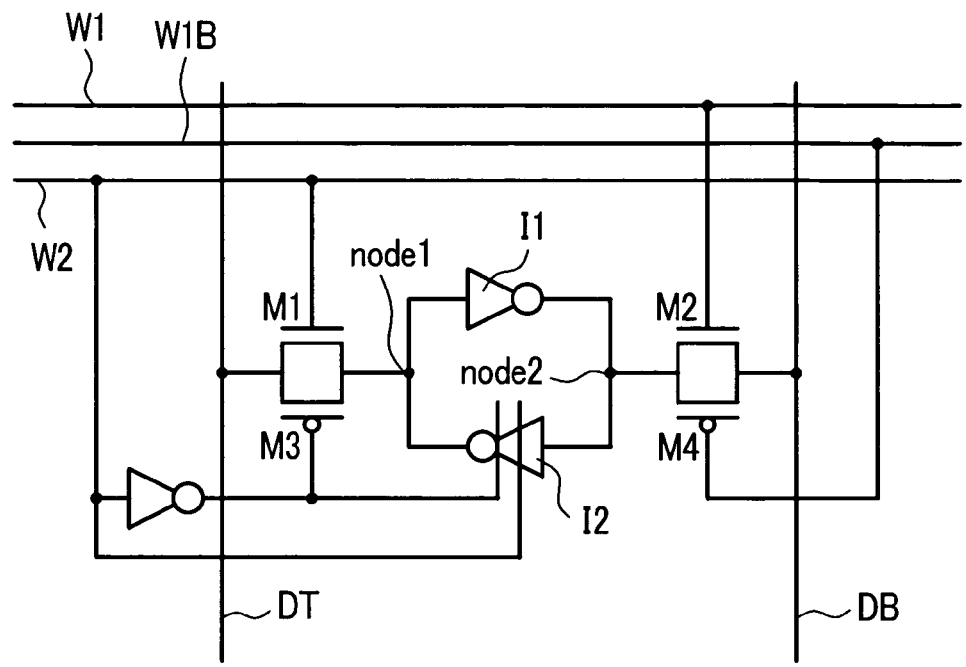
FIG. 4 is a circuit diagram showing one memory cell of a modification of the RAM of the embodiment of the present invention.
Figure 5:
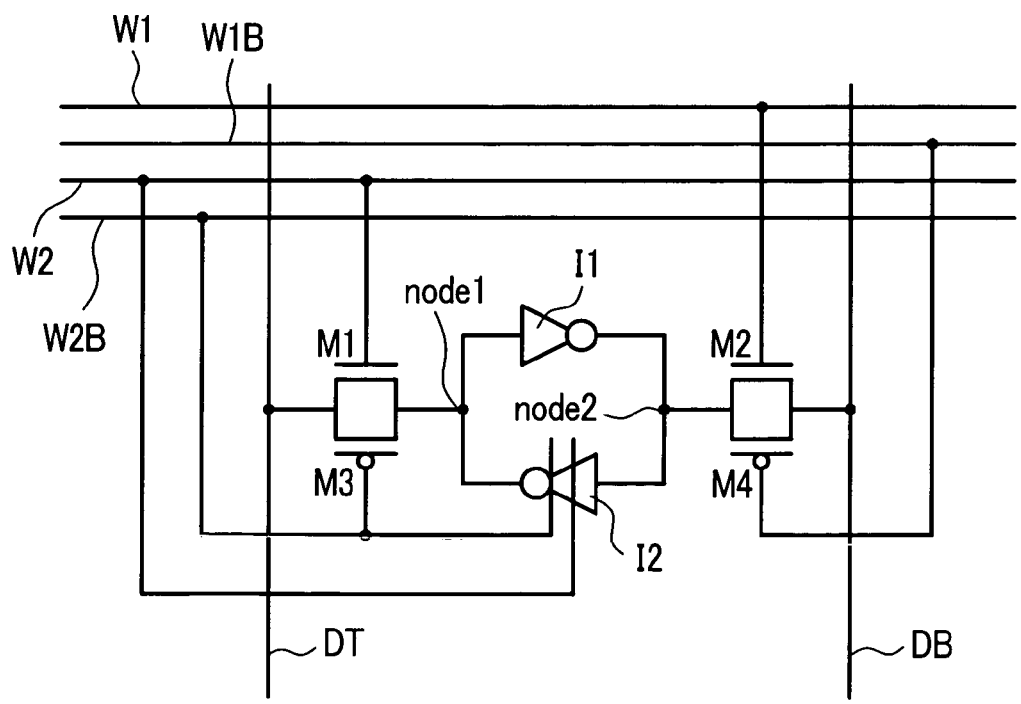
FIG. 5 is a circuit diagram showing one memory cell of a modification of the RAM of the embodiment of the present invention.
Figure 5:
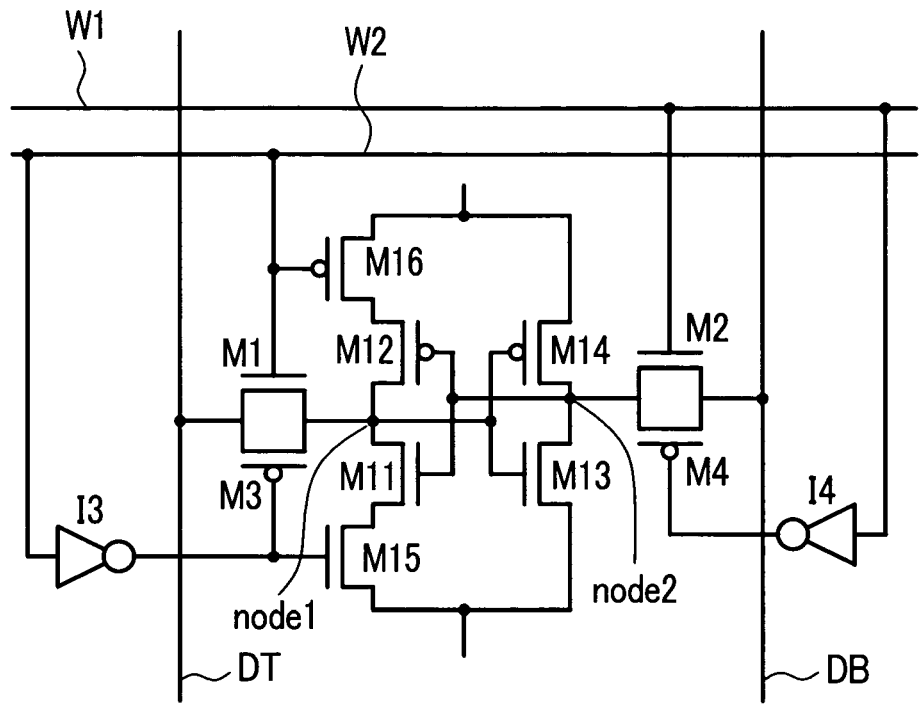
Figure 5:
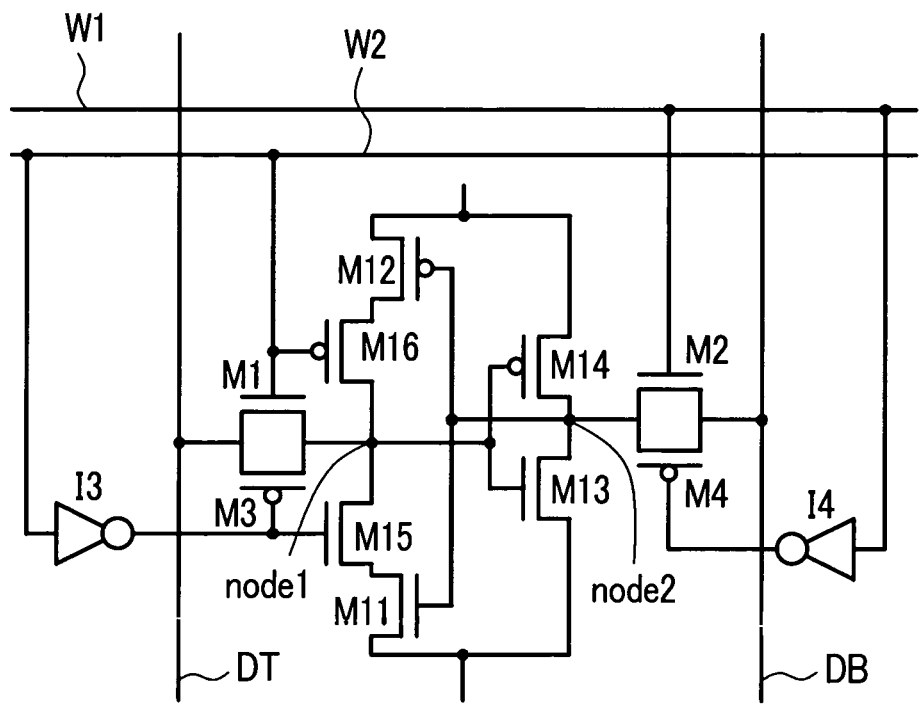

In FIG. 2, although the inverters (I3, I4) are added to drive the PMOS (M2, M4), as shown in FIG. 4, FIG. 5 and FIG. 28, in place of the inverters (I3, I4), the word line (W1), a word line (W1B) to which an inverted signal of the signal applied to the word line (W2), or a word line (W2B) may be added and the signal may be applied to the gates of the PMOS (M2, M4).

Here, in FIG. 4, there is provided a display device which includes a drive circuit to which video data is supplied from the outside, video lines to which video signals outputted from the drive circuit are supplied, and pixels to which the video signals are supplied through the video lines, wherein the drive circuit includes a memory which stores the video data in memory cells, and each memory cell of the memory includes a first inverter (I1) which has an input terminal thereof connected to a first node (node1) and an output terminal thereof connected to a second node (node2), a second inverter (I2) which has an output terminal thereof connected to the first node (node1) and an input terminal thereof connected to the second node (node2), a first-conductive-type first transistor (M1) which is connected between a first data line (DT) and the first node (node1) and has a control terminal thereof connected to a first word line (W2), a third inverter (I3) which has an input terminal thereof connected to the first ward line (W2), a second-conductive-type second transistor (M3) which is connected between the first data line (DT) and the first node (node1) and has a control terminal thereof connected to an output terminal of the third inverter (I3), a first-conductive-type third transistor (M2) which is connected between a second data line (DB) and a second node (node2) and has a control terminal thereof connected to a second word line (W1), a second-conductive-type fourth transistor (M4) which is connected between a second data line (DB) and a second node (node2) and has a control terminal thereof connected to a third word line (W1B).

Further, in FIG. 5, there is provided a display device which includes a drive circuit to which video data is supplied from the outside, video lines to which video signals outputted from the drive circuit are supplied, and pixels to which the video signals are supplied through the video lines, wherein the drive circuit includes a memory which stores the video data in memory cells, and each memory cell of the memory includes a first inverter (I1) which has an input terminal thereof connected to a first node (node1) and an output terminal thereof connected to a second node (node2), a second inverter (I2) which has an output terminal thereof connected to the first node (node1) and an input terminal thereof connected to the second node (node2), a first-conductive-type first transistor (M1) which is connected between a first data line (DT) and the first node (node1) and has a control terminal thereof connected to a first word line (W2), a second-conductive-type second transistor (M3) which is connected between the first data line (DT) and the first node (node1) and has a control terminal thereof connected to a third word line (W2B), a first-conductive-type third transistor (M2) which is connected between a second data line (DB) and the second node (node2) and has a control terminal thereof connected to a second word line (W1), and a second-conductive-type fourth transistor (M4) which is connected between the second data line (W1) and the second node (node2) and has a control terminal thereof connected to the fourth word line (W1B).

Still further, in FIG. 28, there is provided a display device which includes a drive circuit to which video data is supplied from the outside, video lines to which video signals outputted from the drive circuit are supplied, and pixels to which the video signals are supplied through the video lines, wherein the drive circuit includes a memory which stores the video data in memory cells, and each memory cell of the memory includes a first inverter (I1) which has an input terminal thereof connected to a first node (node1) and an output terminal thereof connected to a second node (node2), a second inverter (I2) which has an output terminal thereof connected to the first node (node1) and an input terminal thereof connected to the second node (node2), a first-conductive-type first transistor (M1) which is connected between a first data line (DT) and the first node (node1) and has a control terminal thereof connected to a first word line (W2), a second-conductive-type second transistor (M3) which is connected between the first data line (DT) and the first node (node1) and has a control terminal thereof connected to a third word line (W2B), a first-conductive-type third transistor (M2) which is connected between a second data line (DB) and the second node (node2) and has a control terminal thereof connected to a second word line (W1), a third inverter (I3) which has an input terminal thereof connected to a second word line (W1B), and a second-conductive-type fourth transistor (M4) which is connected between the second data line (DB) and the second node (node2) and has a control terminal thereof connected to an output terminal of the third inverter (I3).

Further, as shown in FIG. 3 to FIG. 5 and FIG. 28, the inverter (I2) may be changed to a clocked inverter and the inverter (I2) may be stopped at the time of writing the data.

By adopting the circuit constitutions shown in FIG. 3 to FIG. 5 and FIG. 28, a load for writing the data into a memory cell can be made small.

For example, in writing data of "1" into a memory cell which has already stored data of "0", it is necessary to change the inner node (node1) from the L-level to the H-level.

In this case, in the circuit constitution shown in FIG. 2, it is necessary to invert both of the inverter (I1) and the inverter (I2). To the contrary, in the circuit constitutions shown in FIG. 3 to FIG. 5 and FIG. 28, only the inverter (I1) may be inverted and hence, it is possible to make the load for writing the data into the memory cell small.

Figure 3:
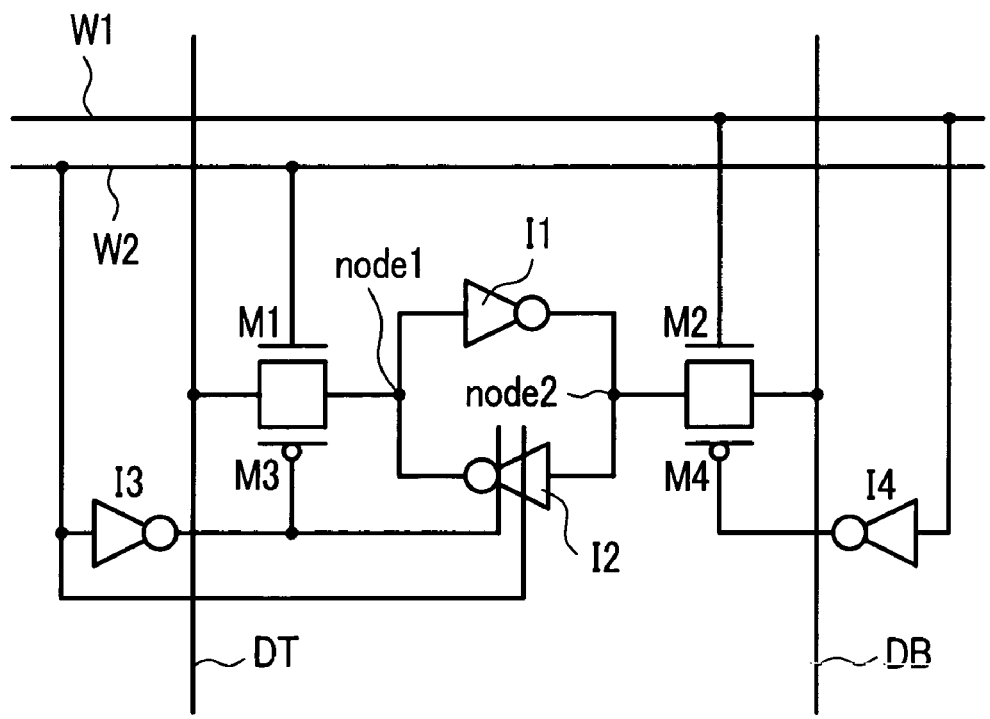
FIG. 3 is a circuit diagram showing one memory cell of a modification of the RAM of the embodiment of the present invention.

The more specific circuit constitution of one memory cell shown in FIG. 3 is shown in FIG. 5A and FIG. 5B.

In FIG. 5A and FIG. 5B, the NMOS (M13) and the PMOS (M14) constitute the inverter (I1) shown in FIG. 3 and the NMOS (M11, M15) and the PMOS (M12, M16) constitute the clocked inverter (I2) shown in FIG. 3.

In FIG. 5A and FIG. 5B, when the word line (W2) assumes the H-level, the NMOS (M15) and the PMOS (M16) are turned off, while when the word line (W2) assumes the L-level, the NMOS (M15) and the PMOS (M16) are turned on and hence, in performing the writing of data, it is possible to stop the clocked inverter (I2).

When the memory cell which requires no precharge of this embodiment is used, all memory cells which are connected with the same word line assume the written/read states. Here, when the memory cells assume the written state, the data of the data line (DT) is surely written and hence, different from the case which uses the conventional memory cells shown in FIG. 27, it is necessary to input the data to all memory cells which are connected to the same word line.

Accordingly, to perform the writing of data, to hold the data of the memory cells which are connected to the same word lines (W1, W2) and to which the writing is not performed, it is necessary to perform an operation to read the data from the memory cells once and, thereafter, to rewrite the read data.

Figure 6:
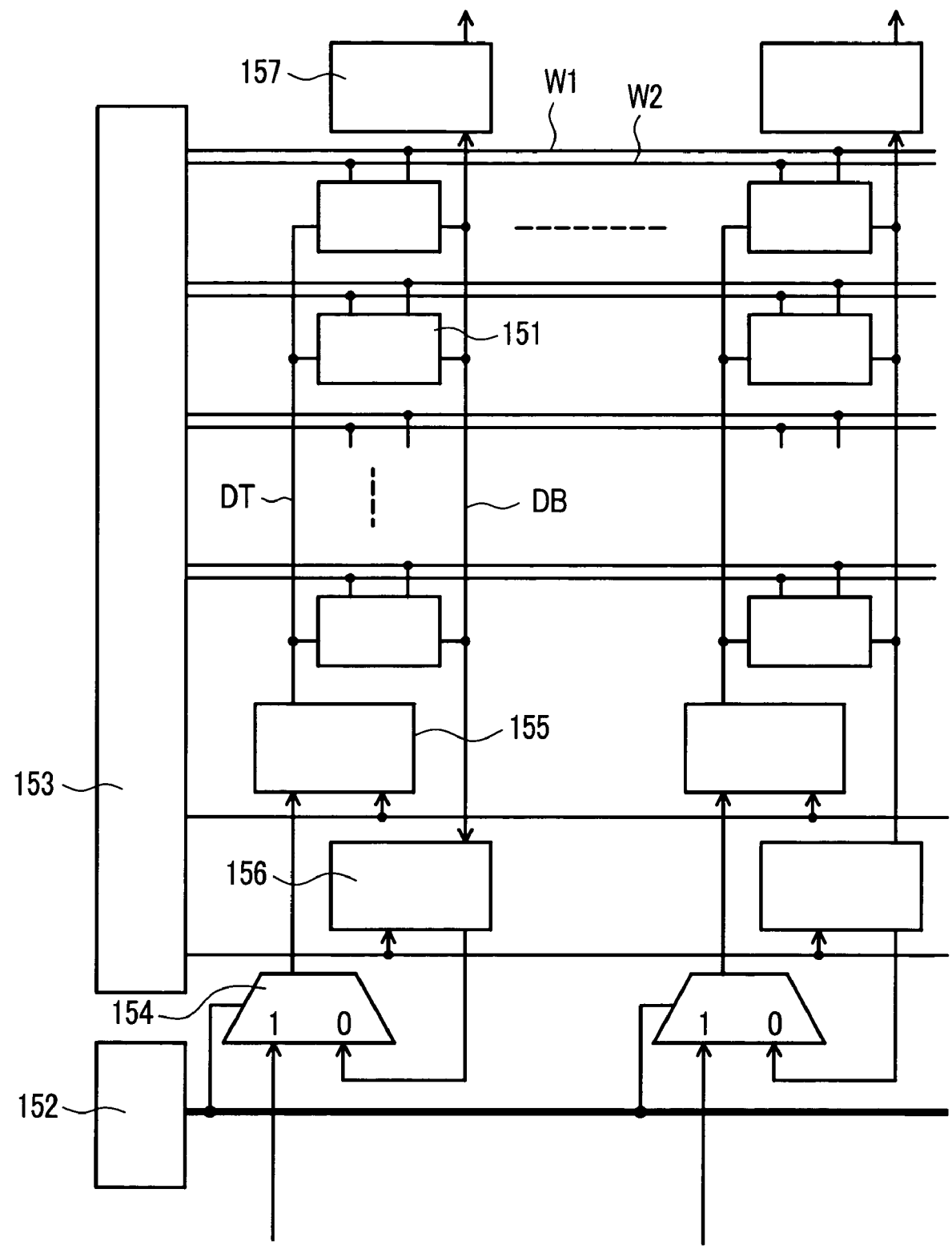
FIG. 6 is a block diagram showing the inner constitution of a RAM of the embodiment of the present invention.

FIG. 6 shows such a constitutional example.

In FIG. 6, numeral 151 indicates the memory cells shown in FIG. 2, numeral 152 indicates an X direction control circuit, numeral 153 indicates a Y direction control circuit, numeral 154 indicates a multiplexer, numeral 155 indicates a writing circuit, numerals 156, 157 indicate reading circuits.

In performing the writing of data, using the reading circuit 156, the reading of data of the memory cells which are connected to the same word line (W2) is performed once.

Thereafter, the multiplexer 154 is controlled by the X direction control circuit 152 and performs the selection of transcribing or rewriting and the writing of data of the selected memory cells is performed using the writing circuit 155.

Due to the above-mentioned operations, it is possible to hold the data of the memory cells which are connected to the same word line (W1) and to which the writing of data is not performed at the time of writing the data.

With the use of a drive circuit which incorporates the SRAM of this embodiment therein, it is possible to reduce the power consumption of the liquid crystal display module.

Figure 7:
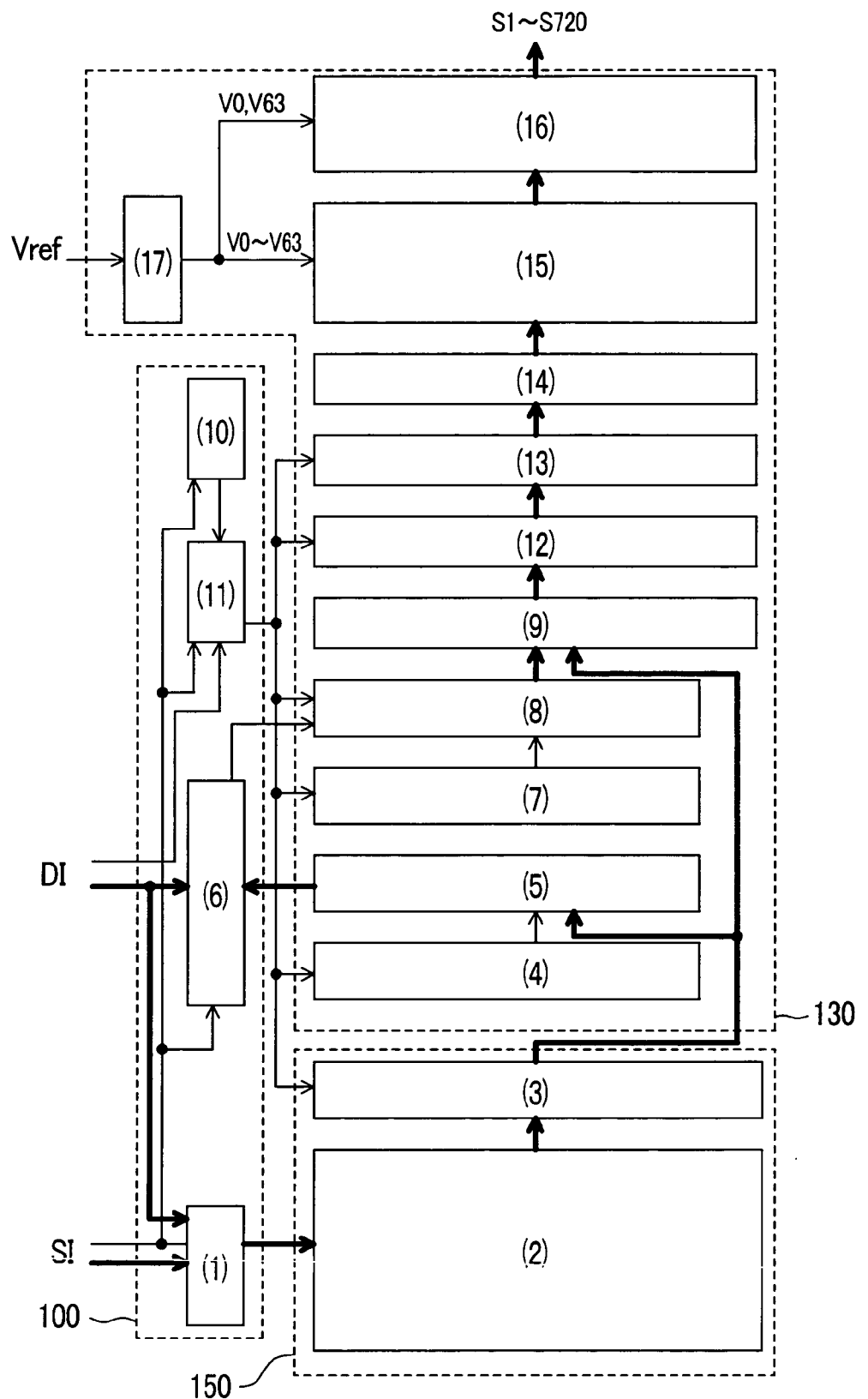
FIG. 7 is a block diagram showing the schematic constitution of one example of a controller circuit, a source driver and a SRAM shown in FIG. 1.

FIG. 7 is a block diagram showing the schematic constitution of one example of the controller circuit 100, the source driver 130 and the RAM 150 shown in FIG. 1.

In the constitution shown in FIG. 7, the controller circuit 100 is constituted of a SRAM control circuit 1, an arithmetic operation circuit 6 for external data and SRAM data, an oscillator 10 and a display timing generating circuit 11.

Further, the source driver 130 is constituted of a parallel-serial conversion shift register (1)4 for SRAM data, a selector circuit 5 for SRAM data, a serial-parallel conversion shift register (2)7 for display data, a display data latch circuit (1)8, a selector circuit 9 for arithmetic operation data and SRAM data, a display data latch circuit (2)12, a display data latch circuit (3)13, a level shift circuit 14, a DA conversion circuit (a gray scale voltage decode circuit) 15, an output circuit (a current amplifying amplifier circuit) 16, and a gray scale voltage generating circuit 17.

Further, the RAM 150 is constituted of the SRAM2 and the SRAM data latch circuit 3.

The constitution shown in FIG. 7 is characterized by including two shift registers (4, 7), the SRAM 2 for holding image data and the arithmetic operation circuit 6 for external data and SRAM data.

In the constitution shown in FIG. 7, the image data from the SI (system interface) is inputted to the SRAM control circuit 1 and, thereafter, is fed to the SRAM 2. The data stored in the SRAM 2 is latched by the SRAM data latch circuit 3 and, thereafter, is used to display images on the liquid crystal panel (PNL).

Further, the image data from the DI (RGB interface) is inputted to the SRAM control circuit 1 or the arithmetic operation circuit 6 for external data and SRAM data and, thereafter, is fed to the SRAM2 or the display data latch circuit 1(8).

The data which is fed to the SRAM 2 is held by an amount corresponding to the RAM capacitance and is used as a frame memory for still pictures or motion pictures.

The RAM capacitance is changed depending on the number of pixels and the number of display colors of the liquid crystal panel (PNL). To hold the capacitance for all number of pixels or all gray scales, or to overlap a clock display or the like on a display image in a mobile phone, the RAM capacitance may exceed the number of pixels of the liquid crystal panel (PNL).

To the contrary, the RAM capacitance merely holds an amount corresponding only to the information of a standby screen of the mobile phone (only clock display).

For example, there is considered a case in which QVGA does not have the RAM capacitance corresponding to total 320 lines and only has the RAM capacitance corresponding to total 96 lines or a case in which display colors are limited to only eight colors (one bit for respective RGB). Here, to allow the RAM capacitance to hold only the image information of the standby screen is to realize the low power consumption.

With the use of the SRAM 2, it is possible to display still images on the liquid crystal panel (PNL) without driving an external bus. Here, a state in which the display lines are limited or the display colors are limited during the standby time is referred to as a partial display.

The external data fed to the display latch circuit (1)8 is subjected to the serial-parallel conversion by the serial-parallel conversion shift register (2)7 of the display data and is sequentially stored in the display data latch circuit (1)8 as the display data corresponding to one scanning line of the liquid crystal panel (PNL) and constitutes the video data for one scanning line.

In the constitution shown in FIG. 7, since the data stored in the SRAM2 and the external data are independent from each other, it is possible to perform the arithmetic processing.

Here, the arithmetic processing is mainly constituted of overlapping of the data stored in the SRAM2 and the external data or the like. In general, it is possible to arbitrarily set the transmissivities and the like of the respective data.

With respect to the arithmetic processing, following two techniques (a), (b) are available.

(a) Since the external data is the serial data which is inputted continuously, the arithmetic processing is performed continuously by making the stored SRAM data subjected to the parallel-serial conversion.

(b) By making the external data subjected to the parallel-serial conversion, the arithmetic processing of the SRAM data is performed collectively for one scanning line.

The constitution shown in FIG. 7 corresponds to the case (a). In this technique, since it is sufficient to provide only one arithmetic circuit for the SRAM data and the external data, it is possible to reduce a circuit scale compared to the case (b) which requires the arithmetic processing circuits for the SRAM data and the external data which correspond to the number of outputs of the video lines.

To realize the above-mentioned technique (a), it is necessary to provide the parallel-serial conversion shift register (1)4 for the SRAM data, the selector circuit 5 for the SRAM data and the arithmetic processing circuit 6 for the external data and the SRAM data. These parts requires a less area compared to an area necessary for arranging the arithmetic processing circuits for respective video lines.

The shift register (1)4 is a shift register which performs the parallel-serial conversion of the SRAM data, wherein the selected SRAM data is fed to the arithmetic processing circuit 6 by the selector circuit 5 and the arithmetic processing is executed.

The serial data after the arithmetic processing is fed to the display data latch circuit (1)8 and, thereafter, is subjected to the serial-parallel conversion by the serial-parallel conversion shift register (2)7 for the display data. Then, the data is sequentially stored in the display data latch circuit (1)8 as the display data for one scanning line of the liquid crystal panel (PNL) and constitutes the video data for one scanning line.

Any one of the display data (external data, post-arithmetic-processing-data of external data and SRAM data or RAM data) latched by the display data latch circuit (1)8 is selected by the selector circuit 9 and is held by a display data latch circuit (2)12 and a display data latch circuit (3)13 as the data for one scanning line.

Here, there may be a case that the display data latch circuit (3)13 is not specifically necessary depending on the timing of the signal inputted from the DI (RGB interface).

The selector circuit 9 for the arithmetic processing data and the SRAM data, the display data latch circuit (2)12 and the display data latch circuit (3) 13 are operated in response to a display timing clock (CL1) which is generated by the display timing generating circuit 11.

When there is no synchronizing signal (dot clock) inputted from the DI (RGB interface), it is necessary to generate the timing clock for synchronization by an inner oscillator 10.

This may be applicable to a system which uses only the SI (system interface) or a partial display time which performs the low-power consumption display.

The video data which is latched to the data latch circuit (3)13 has a voltage level thereof ocnverted by the level shift circuit 14 and, thereafter, is converted into an analogue gray scale voltage in the DA conversion circuit (gray scale voltage decode circuit) 15.

This gray scale voltage has a current thereof amplified by the output circuit (current amplifying amplifier circuit) 16 and is outputted to the respective video lines (S1 to S720).

Here, in the DA conversion circuit (gray scale voltage decode circuit) 15, the gray scale voltages of 64 gray scales (V0 to V63) which are generated by the gray scale voltage generating circuit 17 are inputted.

In the constitution shown in FIG. 7, the flow of the image data advances as follows.

(1) Image Data from DI (RGB Interface)
mode A: when the flow does not advance through the RAM
arithmetic operation circuit 6 of external data and SRAM data→display data latch circuit (1)8→selector circuit 9 of arithmetic operation data and RAM data (usual display)
mode B: when the flow advances through the RAM
equal to the mode C described below (usual display)
(2) image data from SI (system interface)
mode C: when the arithmetic operation is not performed
SRAM control circuit 1→SRAM2→SRAM data latch circuit 3→selector circuit 9 of arithmetic operation data and RAM data (usual display or partial display)
mode D: when the arithmetic operation is performed
SRAM control circuit 1→SRAM2→SRAM data latch circuit 3→selector circuit 5 for SRAM data→arithmetic operation circuit 6 of external data and SRAM data→display data latch circuit (1)8→the selector circuit 9 of the arithmetic operation data and the RAM data (usual display (overlapped))

Further, the display timing clock (CL1) is generated by the synchronizing clock (DOTCLK) which is included in the DI (RGB interface) when the DI (RGB interface) is used, a clock generated by the oscillator 10 is used as the clock when the DI (RGB interface) is not used.

The respective modes are explained hereinafter.
(1) Mode A

FIG. 8A shows a flow of the image data in the mode A and illustrates the flow to the display data latch circuit (2)12 shown in FIG. 7.

Further, FIG. 8B is a view which schematically shows the image displayed on the liquid crystal panel (PNL) in the mode A. Here, although FIG. 8B is a view which displays 260 thousand colors assuming 6 bits for respective RGB, the number of colors and the number of pixels are not limited to these values.

The flow of the image data in the mode A advances in order of DI (RGB interface)→arithmetic operation circuit 6→display data latch circuit (1)8→selector circuit 9→display data latch circuit (2)12.

In this manner, in the mode A, the SRAM 2, the SRAM data latch circuit 3, the shift register (1)4 and the selector circuit 5 are not used and hence, it is possible to stop the operations of these circuits.

Further, also with respect to the arithmetic operation circuit 6 and the selector circuit 9, the SRAM2 is not used and hence, it is possible to allow the data to pass therethrough.

Further, in case of the DI (RGB interface), since the synchronizing clock is also inputted, it is not necessary to specifically provide the oscillator 10.

However, since the time of several ms becomes necessary until the operation of the oscillator 10 becomes stable, to cope with the quick state change to the state of the mode C which uses the oscillator 10, it is possible to allow the oscillator 10 to keep on the operation.

Here, when a boosting clock which is used in the liquid crystal drive power source generating circuit 120 is generated based on the clock generated by the oscillator 10, it is necessary to keep on the operation of the oscillator 10. The same goes for the respective modes explained hereinafter.
(2) Mode B FIG. 9A shows a flow of the image data in the mode B and illustrates the flow to the display data latch circuit (2)12 shown in FIG. 7.

Further, FIG. 9B is a view which schematically shows the image displayed on the liquid crystal panel (PNL) in the mode B. Here, although FIG. 9B is a view which displays 260 thousand colors assuming 6 bits for respective RGB, the number of colors and the number of pixels are not limited to these values.

The flow of the image data in the mode B advances in order of DI (RGB interface)→SRAM control circuit 1→SRAM2→SRAM data latch circuit 3→selector circuit 9→display data latch circuit (2)12.

In this manner, in the mode B, the shift register (1)4, the selector circuit 5, arithmetic operation circuit 6, the shift register (2)7 and display data latch circuit (1)8 are not used and hence, it is possible to stop the operations of these circuits.

Further, also with respect to the selector circuit 9, the SRAM2 is not used and hence, it is possible to allow the data to pass therethrough.

Further, in case of the DI (RGB interface), since the synchronizing clock is also inputted, it is not necessary to specifically provide the oscillator 10.

However, since the time of several ms becomes necessary until the operation of the oscillator 10 becomes stable, to cope with the quick state change to the state of the mode C which uses the oscillator 10, it is possible to allow the oscillator 10 to keep on the operation.
(3) Mode C FIG. 10A shows a flow of the image data in the mode C and illustrates the flow to the display data latch circuit (2)12 shown in FIG. 7.

The mode C is substantially equal to the mode B shown in FIG. 9A except for that the image data inputted to the SRAM control circuit 1 is inputted from the SI (system interface) and hence, the repeated explanation is omitted.

However, in the mode C, since the synchronizing clock is not inputted from the SI (system interface), the clock generated by the oscillator 10 is used as the display timing clock (CL1).

Figure 10:
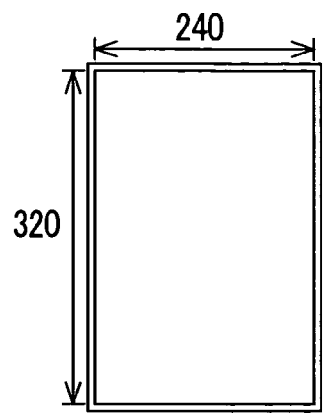
FIG. 10 is a view showing a flow of image data and a display image of a liquid crystal panel in a mode C in the constitution shown in FIG. 7.
Figure 10:
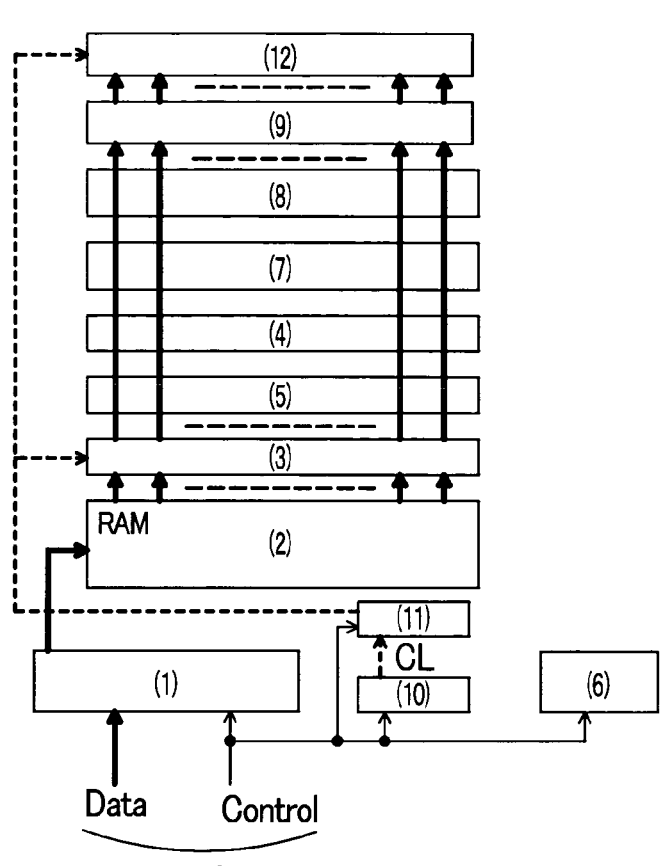
Figure 10:
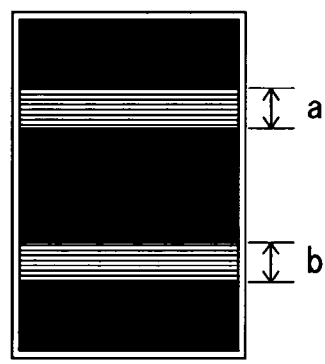

Further, FIG. 10B schematically shows the image displayed on the liquid crystal panel (PNl) in a usual display state in the mode C. Although FIG. 10B is a view which displays 260 thousand colors assuming 6 bits for respective RGB, the number of colors and the number of pixels are not limited to these values.

Further, FIG. 10C schematically shows the image displayed on the liquid crystal panel (PNL) in a partial display state in the mode C. Here, regions "a" and "b" in FIG. 10C indicate portions which are displayed in eight colors and other regions indicate a non-display region of white or black.

Further, although FIG. 10C describes a case in which the

SRAM data are in eight colors, the number of colors and the number of partial display lines ("a" and "b" in FIG. 10C) are not limited to these values.

(4) Mode D

Figure 11:
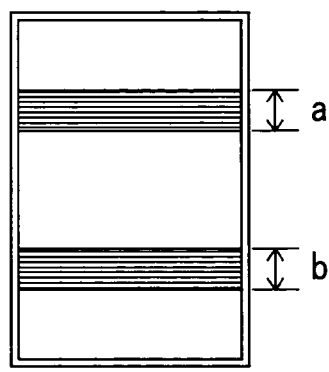
FIG. 11 is a view showing a flow of image data and a display image of a liquid crystal panel in a mode D in the constitution shown in FIG. 7.
Figure 11:
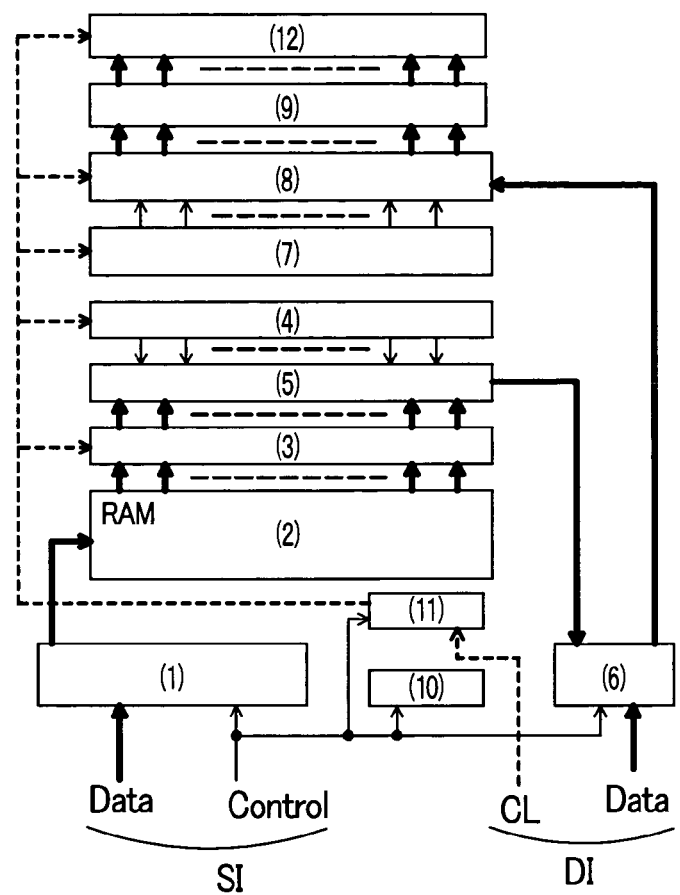

FIG. 11A shows a flow of the image data in the mode D and illustrates the flow to the display data latch circuit (2)12 shown in FIG. 7.

Further, FIG. 11B is a view which schematically shows the image displayed on the liquid crystal panel (PNL) in the mode D. Here, "a" and "b" in FIG. 11B indicate regions where 8 color and 260 thousand colors are overlapped and a remaining portion indicates a display region of 260 thousand colors. Further, in FIG. 11B, although 260 thousand colors are displayed assuming 6 bits for respective RGB, the number of colors and the number of pixels are not limited to these values. In the same manner, although a case in which the SRAM data is 8 colors is displayed, the number of colors and the number of overlapped display lines ("a" and "b" in FIG. 11B) are not limited to these values.

The flow of the image data in the mode D advances in two routes. In one route, the flow advances in order of SI (system interface)→SRAM control circuit 1→SRAM2→SRAM data latch circuit 3→selector circuit 5 of SRAM data→arithmetic operation circuit 6→display data latch circuit (1)8→selector circuit 9→display data latch circuit (2)12. In another route, the flow advances in the course of DI (RGB interface)→arithmetic operation circuit 6→display data latch circuit (1)8→selector circuit 9→display data latch circuit (2)12.

Further, in the mode D, since the synchronizing clock is also inputted from the DI (RGB interface), it is not necessary to specifically provide the oscillator 10.

However, since the time of several ms becomes necessary until the operation of the oscillator 10 becomes stable, to cope with the quick state change to the state of the mode C which uses the oscillator 10, it is possible to allow the oscillator 10 to keep on the operation.

Further, by executing the arithmetic operation in the arithmetic operation circuit 6, it is possible to perform the display by allowing the whole overlapped display line part (("a" and "b" in FIG. 11B) to be displayed in 8 colors, or by allowing a portion of the overlapped display line part to be displayed in 260 thousand colors and a remaining portion to be displayed in 8 colors, or by allowing respective 50% of SRAM data and the external data inputted from the DI (RGB interface) to be displayed in a transmissive manner.

Figure 12:
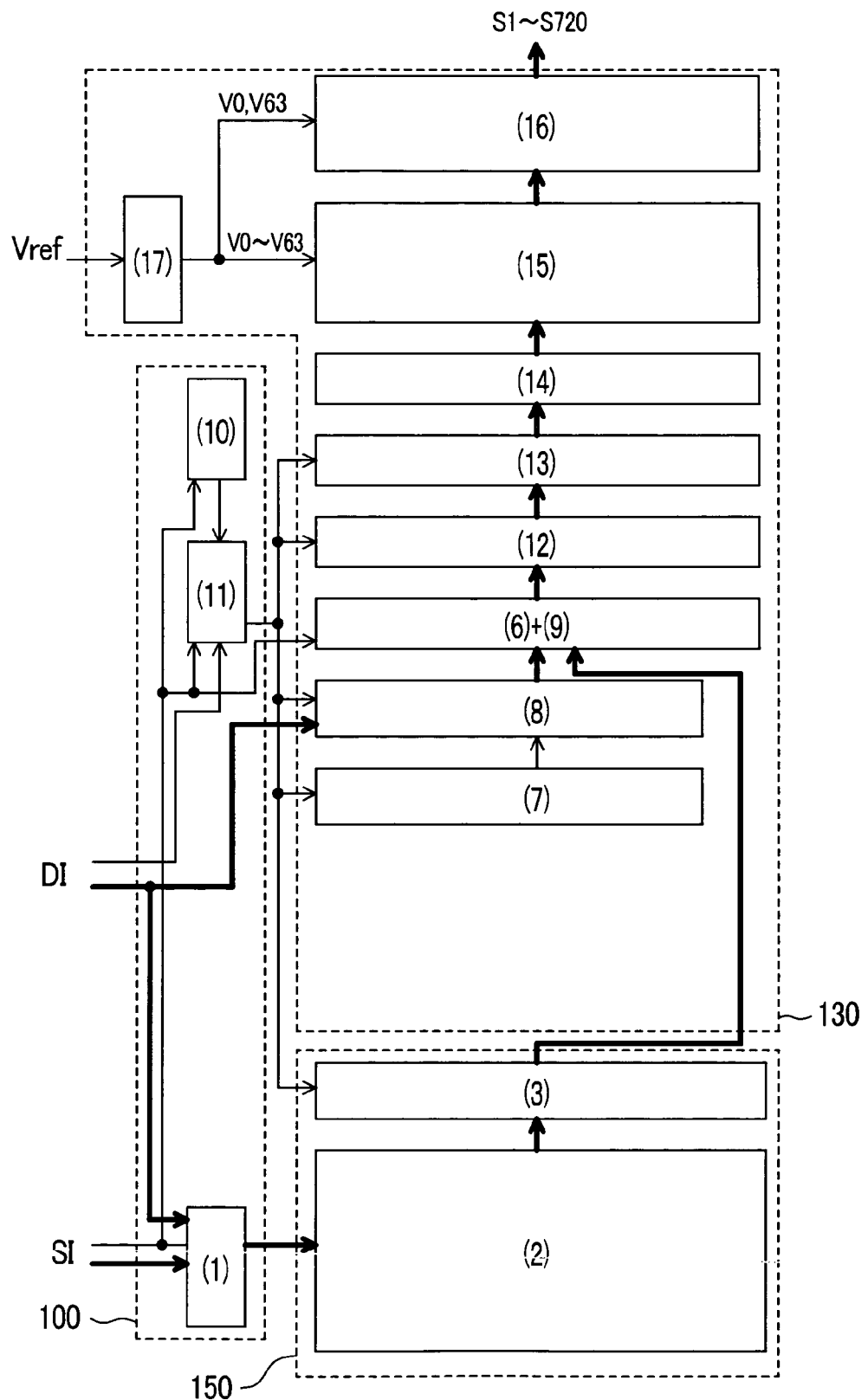
FIG. 12 is a block diagram showing the schematic constitution of another example of a controller circuit, a source driver and a SRAM shown in FIG. 1.

FIG. 12 is a block diagram showing another example of the schematic constitution of the controller circuit, the source driver circuit and the SRAM shown in FIG. 1.

The constitution shown in FIG. 12 is characterized by having the arithmetic operation circuit 6 for external data and SRAM data for every bit of the video data, wherein the external data is subjected to the serial-parallel conversion and the arithmetic operation of the external data together with the SRAM data is performed for one scanning line correctively.

Points which make this constitution different from the constitution shown in the block diagram of FIG. 7 lies in that the parallel-serial conversion shift register (1)4 for the SRAM data and the selector circuit 5 for the SRAM data are omitted and the arithmetic operation circuit 6 for external data and SRAM data is provided in the inside of the selector circuit 9 of the arithmetic operation data and the SRAM data for every bit of the video data.

As in the case of the constitution shown in FIG. 12, when the arithmetic operation circuit 6 is provided for every video bit, the circuit scale is enlarged and hence, the chip sized is enlarged. However, it is unnecessary to match arithmetic operation circuit 6 to the transfer period of the external data, there arises a margin in timing. The operation may be performed with a period for every outputting to one scanning line.

Further, in the constitution shown in FIG. 12, when the shrinking of process progresses and an area of the digital circuit can be reduced, the influence attributed to the enlargement of the circuit of this constitution becomes small as a whole, the increase of timing margin brings about the more allowance in designing.

In the constitution shown in FIG. 12, the flow of the image data advances as follows.

(1) Image Data from DI (RGB Interface)

mode A: when the flow does not advance through the RAM display data latch circuit (1)8→arithmetic operation circuit 6 of external data and SRAM data→selector circuit 9 of arithmetic operation data and RAM data mode B: when the flow advances through the RAM equal to the mode C described below (2) Image Data from SI (System Interface)

mode C: when the arithmetic operation is not performed SRAM control circuit 1→SRAM2→SRAM data latch circuit 3→selector circuit 9 of arithmetic operation data and RAM mode D: when the arithmetic operation is performed SRAM control circuit 1→SRAM2→SRAM data latch circuit 3→arithmetic operation circuit 6 for external data and SRAM data→selector circuit 9 of the arithmetic operation data and the RAM data Further, the respective modes are explained hereinafter.

(1) Mode A

Figure 13:
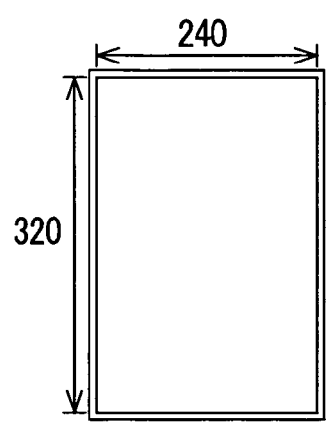
FIG. 13 is a view showing a flow of image data and a display image of a liquid crystal panel in a mode A in the constitution shown in FIG. 12.
Figure 13:
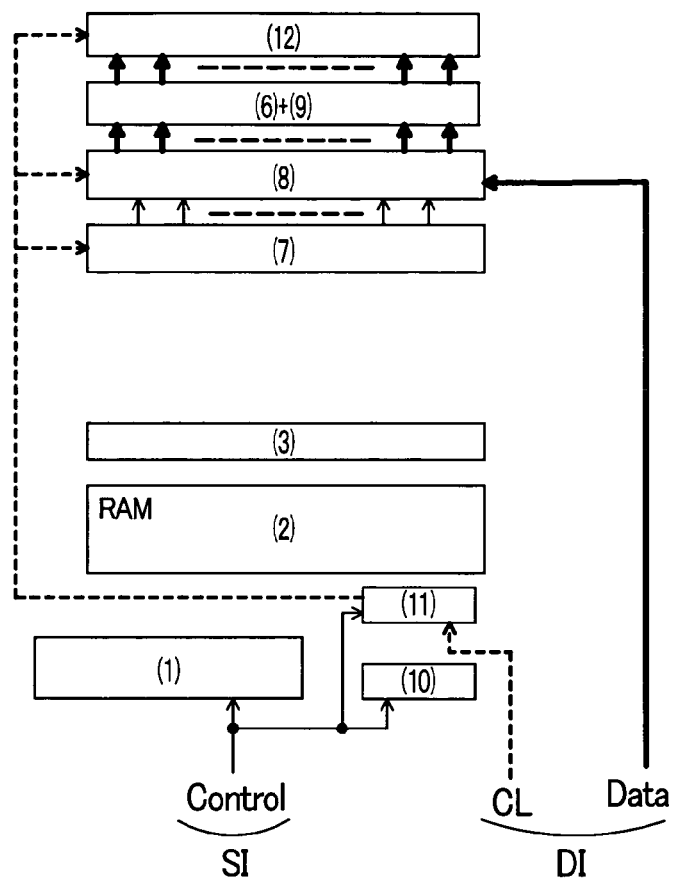

FIG. 13A shows a flow of the image data in the mode A and illustrates the flow to the display data latch circuit (2)12 shown in FIG. 12.

Further, FIG. 13B is a view which schematically shows the image displayed on the liquid crystal panel (PNL) in the mode A. Here, although FIG. 13B is a view which displays 260 thousand colors assuming 6 bits for respective RGB, the number of colors and the number of pixels are not limited to these values.

The flow of the image data in the mode A advances in order of DI (RGB interface)→display data latch circuit (1)8→ (arithmetic operation circuit 6+selector circuit 9)→display data latch circuit (2)12.

In this manner, in the mode A, the SRAM 2 and the SRAM data latch circuit 3 are not used and hence, it is possible to stop the operations of these circuits.

Further, also with respect to the arithmetic operation circuit 6 and the selector circuit 9, the SRAM2 is not used and hence, it is possible to allow the data to pass therethrough.

Further, in case of the DI (RGB interface), since the synchronizing clock is also inputted, it is not necessary to specifically provide the oscillator 10.

However, since the time of several ms becomes necessary until the operation of the oscillator 10 becomes stable, to cope with the quick state change to the state of the mode C which uses the oscillator 10, it is possible to allow the oscillator 10 to keep on the operation.

(2) Mode B

FIG. 14A shows a flow of the image data in the mode B and illustrates the flow to the display data latch circuit (2)12 shown in FIG. 12.

Further, FIG. 14B is a view which schematically shows the image displayed on the liquid crystal panel (PNL) in the mode B. Here, although FIG. 14B is a view which displays 260 thousand colors assuming 6 bits for respective RGB, the number of colors and the number of pixels are not limited to these values.

The flow of the image data in the mode B advances in order of DI (RGB interface)→SRAM control circuit 1→SRAM 2→SRAM data latch circuit 3→(arithmetic operation circuit 6+selector circuit 9)→display data latch circuit (2)12.

In this manner, in the mode B, the shift register (2)7 and display data latch circuit (1)8 are not used and hence, it is possible to stop the operations of these circuits.

Further, also with respect to the arithmetic operation circuit 6 and the selector circuit 9, the SRAM2 is not used and hence, it is possible to allow the data to pass therethrough.

Further, in case of the DI (RGB interface), since the synchronizing clock is also inputted, it is not necessary to specifically provide the oscillator 10.

However, since the time of several ms becomes necessary until the operation of the oscillator 10 becomes stable, to cope with the quick state change to the state of the mode C which uses the oscillator 10, it is possible to allow the oscillator 10 to keep on the operation.

(3) Mode C

Figure 15:
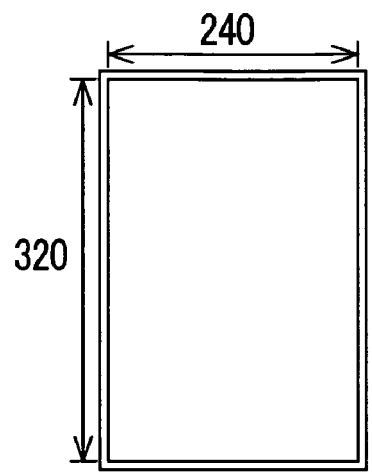
FIG. 15 is a view showing a flow of image data and a display image of a liquid crystal panel in a mode C in the constitution shown in FIG. 12.
Figure 15:
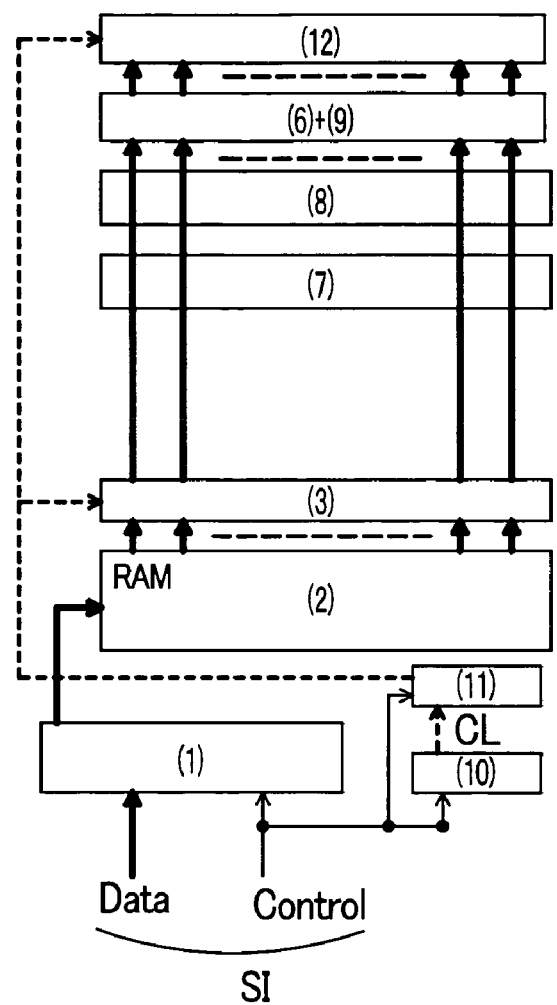
Figure 15:
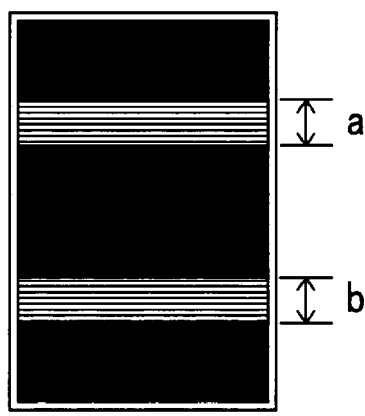

FIG. 15A shows a flow of the image data in the mode B and illustrates the flow to the display data latch circuit (2)12 shown in FIG. 12.

The mode C is substantially equal to the mode B shown in FIG. 14A except for that the image data inputted to the SRAM control circuit 1 is inputted from the SI (system interface) and hence, the repeated explanation is omitted.

However, in the mode C, since the synchronizing clock is not inputted from the SI (system interface), the clock generated by the oscillator 10 is used as the display timing clock (CL1).

Further, FIG. 15B schematically shows the image displayed on the liquid crystal panel (PNL) in a usual display state in the mode C. Here, regions "a" and "b" in FIG. 15C indicate portions which are displayed in eight colors and other regions indicate a non-display region of white or black. Although FIG. 15B is a view which displays 260 thousand colors assuming 6 bits for respective RGB, the number of colors and the number of pixels are not limited to these values.

Further, FIG. 15C schematically shows the image displayed on the liquid crystal panel (PNL) in a partial display state in the mode C. Further, although FIG. 15C describes a case in which the SRAM data are displayed in eight colors, the number of colors and the number of partial display lines ("a" and "b" in FIG. 15C) are not limited to these values.

(4) Mode D

FIG. 16A shows a flow of the image data in the mode D and illustrates the flow to the display data latch circuit (2)12 shown in FIG. 12.

Further, FIG. 16B is a view which schematically shows the image displayed on the liquid crystal panel (PNL) in the mode D. Here, "a" and "b" in FIG. 16B indicate regions where 8 color and 260 thousand colors are overlapped and a remaining portion indicate a display region of 260 thousand colors. Further, in FIG. 16B, although 260 thousand colors are displayed assuming 6 bits for respective RGB, the number of colors and the number of pixels are not limited to these values. In the same manner, although a case in which the SRAM data is 8 colors is illustrated, the number of colors and the number of overlapped display lines ("a" and "b" in FIG. 16B) are not limited to these values.

The flow of the image data in the mode D advances in two routes. In one route, the flow advances in order of SI (system interface)→SRAM control circuit 1→SRAM2→SRAM data latch circuit 3→(arithmetic operation circuit 6+selector circuit 9)→display data latch circuit (2)12. In another route, the flow advances in the course of DI (RGB interface)→display data latch circuit (1)8→(arithmetic operation circuit 6+selector circuit 9)→display data latch circuit (2)12.

Further, in the mode D, since the synchronizing clock is also inputted from the DI (RGB interface), it is not necessary to specifically provide the oscillator 10.

However, since the time of several ms becomes necessary until the operation of the oscillator 10 becomes stable, to cope with the quick state change to the state of the mode C which uses the oscillator 10, it is possible to allow the oscillator 10 to keep on the operation.

Further, by executing the arithmetic operation in the arithmetic operation circuit 6, it is possible to perform the display by allowing the whole overlapped display line part (("a" and "b" in FIG. 11B) to be displayed in 8 colors, or by allowing a portion of the overlapped display line part to be displayed in 260 thousand colors and a remaining portion to be displayed in 8 colors, or by allowing respective 50% of SRAM data and the external data inputted from the DI (RGB interface) to be displayed in a transmissive manner.

Figure 17:
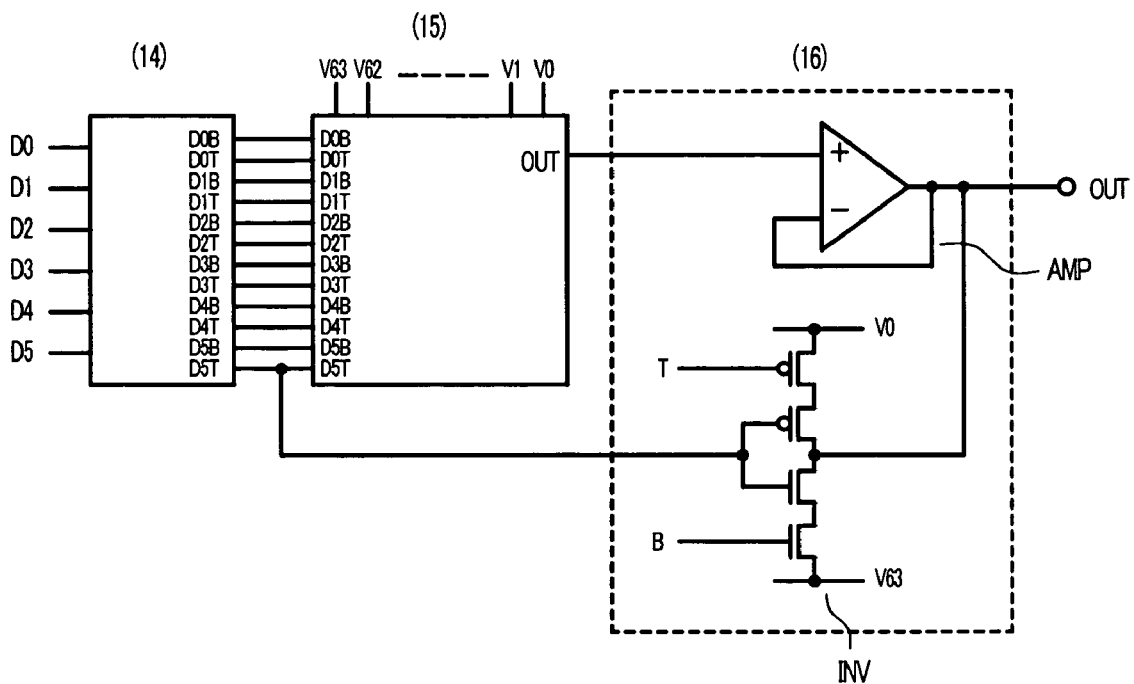
FIG. 17 is a circuit diagram showing one example of an output circuit (a current amplifying circuit) 16 shown in FIG. 7 or FIG. 12.

FIG. 17 is a circuit diagram showing one example of an output circuit (current amplifying amplifier circuit) 16 shown in FIG. 7 or FIG. 12.

As mentioned above, the partial display means the display of 8 total colors (=2×2×2) formed of respective two colors of R, G, B. This partial display is used for displaying only in a clock or the like and is a method which can also reduce the number of using scanning lines.

The circuit shown in FIG. 17 is provided for further reducing the power consumption when the partial display is performed, wherein a clocked inverter (INV) is connected to an operational amplifier (AMP) of the output circuit 16 in parallel and the operational amplifier (AMP) of the output circuit 16 is stopped when the partial display is performed so as to reduce the power consumption.

To this inverter (INV), as a power source voltage, a maximum gray scale voltage (V0) and a minimum gray scale voltage (C63) are supplied and, at the same time, the data which is subjected to level shifting (for example, D5T in FIG. 17) is inputted.

Hereinafter, the operation of the circuit shown in FIG. 17 is explained.

(1) In the Normal Display, the Operational Amplifier (AMP) of the Output Circuit 16 is set to an Operative State.

Further, by setting the clock (T) to the H-level and the clock (B) to the L-level, the operation of the inverter (INV) is stopped (the output is set in a high impedance state).

Here, the H-level of the power source voltage is set higher than the level of the maximum gray scale voltage (V0) and the L-level (GND) of the power source voltage is set lower than the level of the minimum gray scale voltage (V63) and hence, the voltage levels of the clocks (T, B) may be assumed as the power source levels.

(2) In the Partial Display, the Operational Amplifier (AMP) of the Output Circuit 16 is Stopped (the Output is set in a High Impedance State as Well as in a Direct Current (DC) Pass Cut State).

Further, by setting the clock (T) to the L-level and the clock (B) to the H-level, the inverter (INV) is set in an operative state.

To the inverter (INV), data which is subjected to level shifting (for example, D5T) is inputted. Here, the D5T is data which allows the selection of the gray scale voltage of V63 (low) at the time of "1" and data which allows the selection of the gray scale voltage of V0 (high) at the time of "0". Here, one of D0 to D5 may be used as data.

Accordingly, from the output of the inverter (INV), the gray scale voltage of V63 (low) or the gray scale voltage of V0 (high) is outputted.

Accordingly, in the partial display, it is possible that the operational amplifier (AMP) of the output circuit 16 is stopped and the gray scale voltage of V0 or the gray scale voltage of V63 is outputted and hence, in the partial display, it is possible to largely enhance the low power consumption.

Here, when the D5B is used as video data which is inputted to the inverter (INV), by longitudinally connecting the inverter (INV) in series in two stages, a logically correct gray scale voltage can be outputted.

That is, the inverter (INV) may be arranged in n (n≧2) stages. However, to reduce the penetrating current between the voltages (V0, V63) which are applied as the power source voltages of the inverter (INV), it is preferable that the inverter (INV) is arranged in minimum one stage.

Here, although the case in which the video data of 6 bits is shown in FIG. 17, the video data may be of 8 bits and, one of D0 to D7 may be used as inputted data.

In FIG. 17, the data which is necessary in the partial display is only D5T. Therefore, in the partial display, in the level shift circuit 14 shown in FIG. 17, the level shift operations for bits other than D5 bits are not necessary.

Generally, the level shift circuit has a large penetrating current and hence, when the level shift circuit can be stopped, the power consumption reduction effect can be expected.

Figure 18:
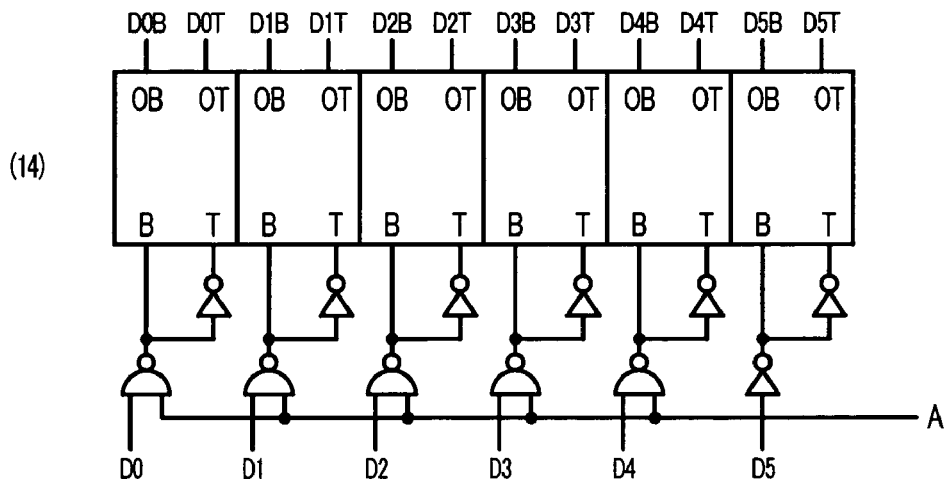
FIG. 18 is a view showing one example of the circuit constitution when a level shift operation of bits other than D5 is stopped at the time of a partial display.

FIG. 18 is a view showing one example of the circuit constitution which is used when the level shift operations having bits other than D5 bits are stopped in the partial display.

In a circuit shown in FIG. 18, in the partial setting, the voltage of the control line A is set to the L-level (GND).

Accordingly, by fixing the output of a NAND circuit to the H-level and by stopping the operation of the D0 to D4 bits, it becomes possible to further reduce the power consumption in the partial display.

Figure 19:
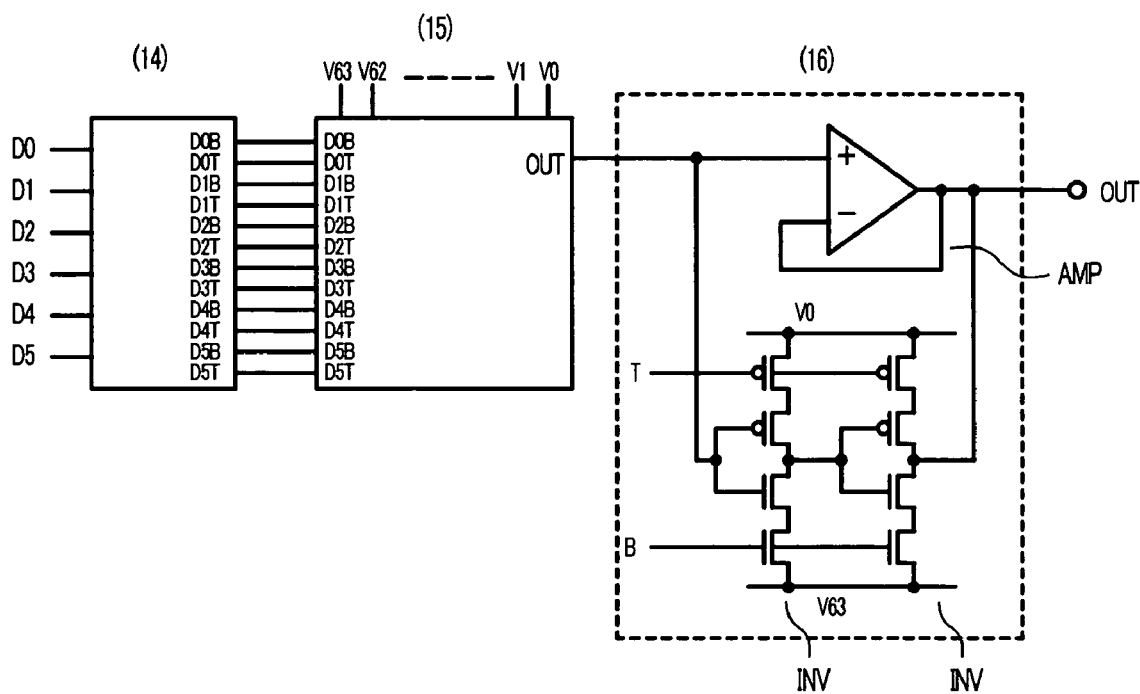
FIG. 19 is a circuit diagram showing another example of an output circuit (a current amplifying circuit) 16 shown in FIG. 7 or FIG. 12.

FIG. 19 is a circuit view showing another example of the output circuit (current amplifying amplifier circuit) 16 shown in FIG. 7 or FIG. 12.

The constitution shown in FIG. 19 is different from the constitution shown in FIG. 17 in that a decoder output (analogue voltage) of the DA conversion circuit (gray scale voltage decode circuit) 15 is used as the input to the inverter (INV).

When the video data cannot be wired to the output circuit 16 in view of the chip layout, this constitution is effective.

In the partial display, it is necessary that the decoder output of the DA conversion circuit 15 directly outputs the gray scale voltage of V0 or the gray scale voltage of V63, or either one of the selected gray scale voltages.

Therefore, in the circuit shown in FIG. 18, to prevent the output from being inverted, it is necessary to longitudinally connect the inverter (INV) in series in even-numbered stages.

In the circuit shown in FIG. 17 or FIG. 19, in a state that the clock (T) which is set to the L-level and the clock (B) which is set to the H-level are inputted to the inverter (INV), when the input voltage of the inverter (INV) is changed, a penetrating current flows.

Even in such a case, although there arises no drawback in the display of the liquid crystal panel (PNL), there exists a possibility that t the power consumption is increased. To decrease this penetrating current, it is necessary to stop the operation of the inverter (INV) when the input voltage of the inverter (INV) is changed.

Figure 20:
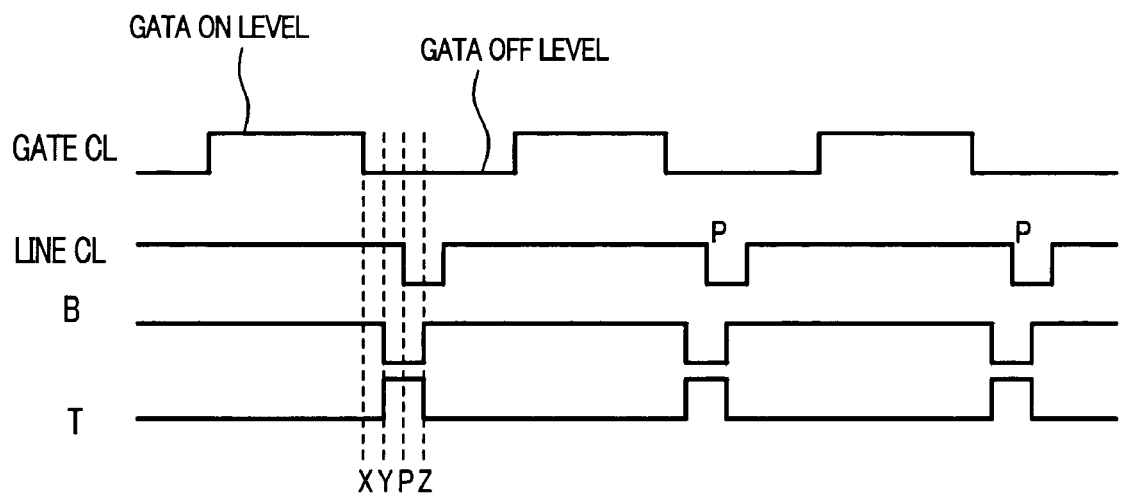
FIG. 20 is a view showing a timing chart for stopping the operation of an inverter (INV) when an input voltage to the inverter (INV) is changed in a circuit shown in FIG. 19.

An example of the operational timing in such a case is shown in FIG. 20.

In FIG. 20, a GATE CL is a clock for turning on or off a gate line (G) of the liquid crystal display panel (PNL), wherein the GATE CL is turned on at the H-level and is turned off at the L-level.

A LINE CL is a latch clock of the display data latch circuit (3)13 in FIG. 7, FIG. 12. In FIG. 20, at the point of falling (P), the data for next scanning line is latched (timing at which data is changed).

When the inverter (INV) is stopped (the clock (T) is set to the H-level and the clock (B) is set to the L-level) at the timing that the data is changed, no penetrating current flows.

Therefore, the falling (P) may be positioned during the Y-Z period shown in FIG. 20.

Here, during the Y-Z period, the output of the inverter (INV) assumes the high impedance state and hence, the driving of the liquid crystal is not performed during this period. However, there arises no specific drawback provided that the liquid crystal can be sufficiently driven during the period after the high impedance state.

Further, when the point Y comes at a time earlier than the X in FIG. 20, the output of the inverter (INV) assumes the high impedance state when the writing is almost finished in the front stage. Accordingly, such a situation is not desirable. However, there arises no drawback provided that the time comes after the voltage is sufficiently written in the liquid crystal and is shorter than time which allows a level charged in the liquid crystal is leaked through a minute leak.

As has been explained heretofore, by stopping the inverter (INV) during the time that the data which is inputted to the inverter (INV) is changed, it is possible to eliminate the penetrating current whereby the further lowering of the power consumption can be realized.

FIG. 21 is a view showing one example of a gray scale voltage generating circuit 17 shown in FIG. 7, FIG. 12.

Generally, in the gray scale voltage generating circuit 17 shown in FIG. 7, FIG. 12, the voltage (Vref in FIG. 21) which is generated in a liquid crystal drive power source generating circuit 120 is divided using a resistance voltage dividing circuit (Ra) and a plurality of gray scale reference voltages (in FIG. 21, five gray scale reference voltages) are generated. Further, the voltage between the gray scale reference voltages is divided using the resistance voltage dividing circuit (Rb) thus generating a plurality of gray scale voltages (in FIG. 21, gray scale voltages of 64 gray scales).

In this case, the plurality of gray scale voltages have electric currents thereof amplified using an amplifying circuit (or a buffer circuit).

In the partial display shown in FIG. 10(c), it is necessary to perform the black or white display on the lines other than the partial display lines.

Here, when only black or white display is performed, as the gray scale voltages which are outputted from a source driver 130 to the video lines (S), only two values, that is, upper and lower values are necessary.

Therefore, as shown in FIG. 21, when the gray scale reference voltage is supplied through the amplifying circuit, in the partial display state, the operation of the amplifying circuits (AMPa to AMPe) other than the amplifying circuits (AMP0, AMP63 in FIG. 21) of the gray scale voltage of V0 and the gray scale voltage of V63 can be stopped and hence, the power consumption can be further reduced.

In this manner, in the partial display, by stopping the amplifying circuits which amplify the electric currents of the gray scale reference voltages which are outputted from the gray scale voltage generating circuit 47, the further low power consumption can be realized.

FIG. 22 is a circuit diagram showing a conventional oscillator.

In an oscillator 10 shown in FIG. 22, five inverters (I11 to I15) are connected in series using resistance elements (R) and, at the same time, a capacitive element (C2) is connected between an inverter (I11) and an inverter (I12) and a power source voltage (Vcc) is supplied to the inverter (I11) through a capacitive element (C1).

In the oscillator 10 shown in FIG. 22, by changing the resistance elements R and capacitive elements (C1, C2), the oscillation frequency can be adjusted.

However, in the conventional oscillator 10, to obtain the stable oscillation frequency, as the resistance element (R), an ordinary resistance element (a so-called exteriorly-mounted resistance element) is used.

That is, since a resistance device having high accuracy cannot be formed using an ordinary CMOS semiconductor or the like, in the inside of the semiconductor chip which constitutes a drive circuit (DRV), the resistance element (R) is not incorporated. The same goes for a case in which the resistance device is formed on the glass substrate using a polysilicon TFT or the like.

In the usual full gray scale display, a clock which is inputted from a DI (RGB interface) is used. Therefore, in this embodiment, when the SRAM data is used exclusively for the partial display, the oscillator 10 shown in FIG. 7 and FIG. 12 is used only in the partial display.

In the partial display, since the number of colors is small and only simple display such as the display of a clock is performed, even when a change occurs to some extent in the alternating period or the like of the liquid crystal, the change is hardly displayed as a disturbance of the image quality.

Therefore, the accuracy of the resistance element which is used in the oscillator 10 has a margin and hence, by incorporating the resistance element in the inside of the semiconductor chip, it is possible to reduce the number of the liquid crystal display module parts.

Further, by incorporating the resistance elements in the inside of the semiconductor chip, it is possible to vary several resistance values under a control of MCU (that is, in software). That is, the resistance values can be adjusted in response to the image quality, the power consumption of the liquid crystal display module, FIG. 23 is a block diagram showing the schematic constitution of the oscillator 10 of this embodiment.

Figure 23:
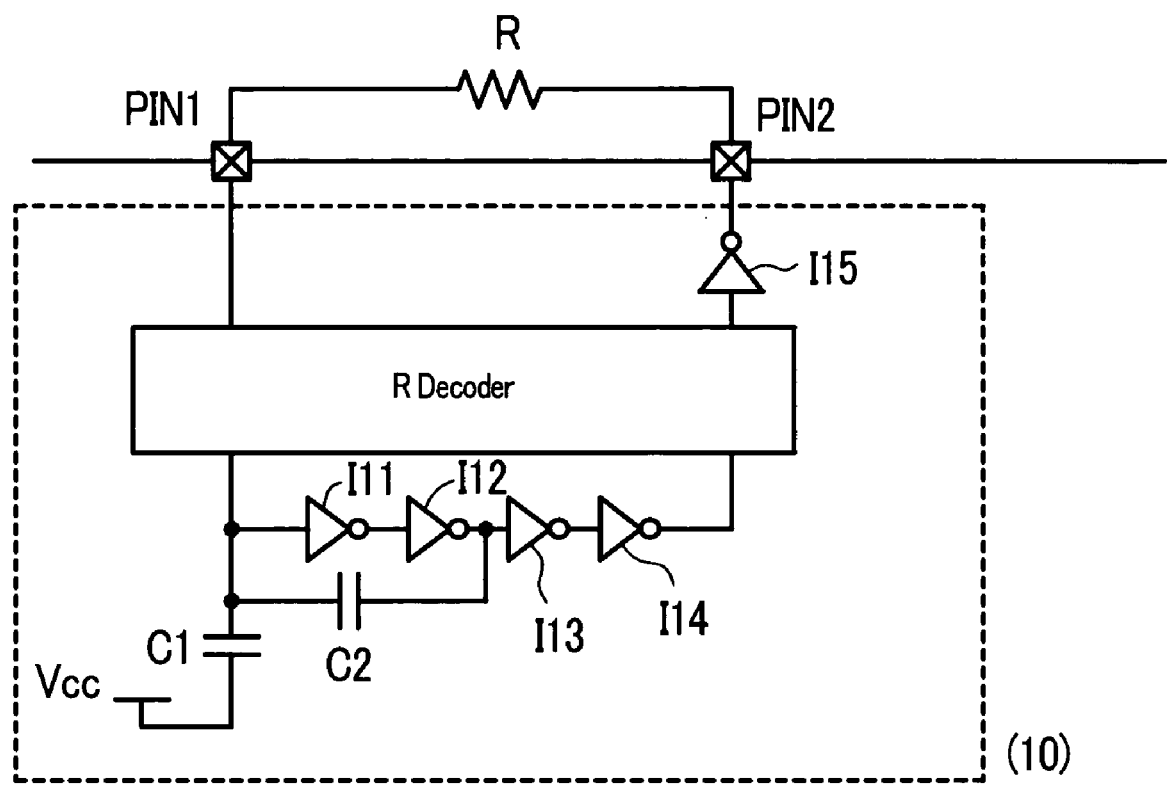
FIG. 23 is a block diagram showing the schematic constitution of an oscillator of the embodiment of the present invention.

In the oscillator 10 shown in FIG. 23, as a resistance element, a resistance array (R Decoder) which is incorporated in the inside of the semiconductor chip is used. Further, to enable the use of the exteriorly-mounted resistance element (R), terminals (PIN1, PIN2) are mounted.

Figure 24:
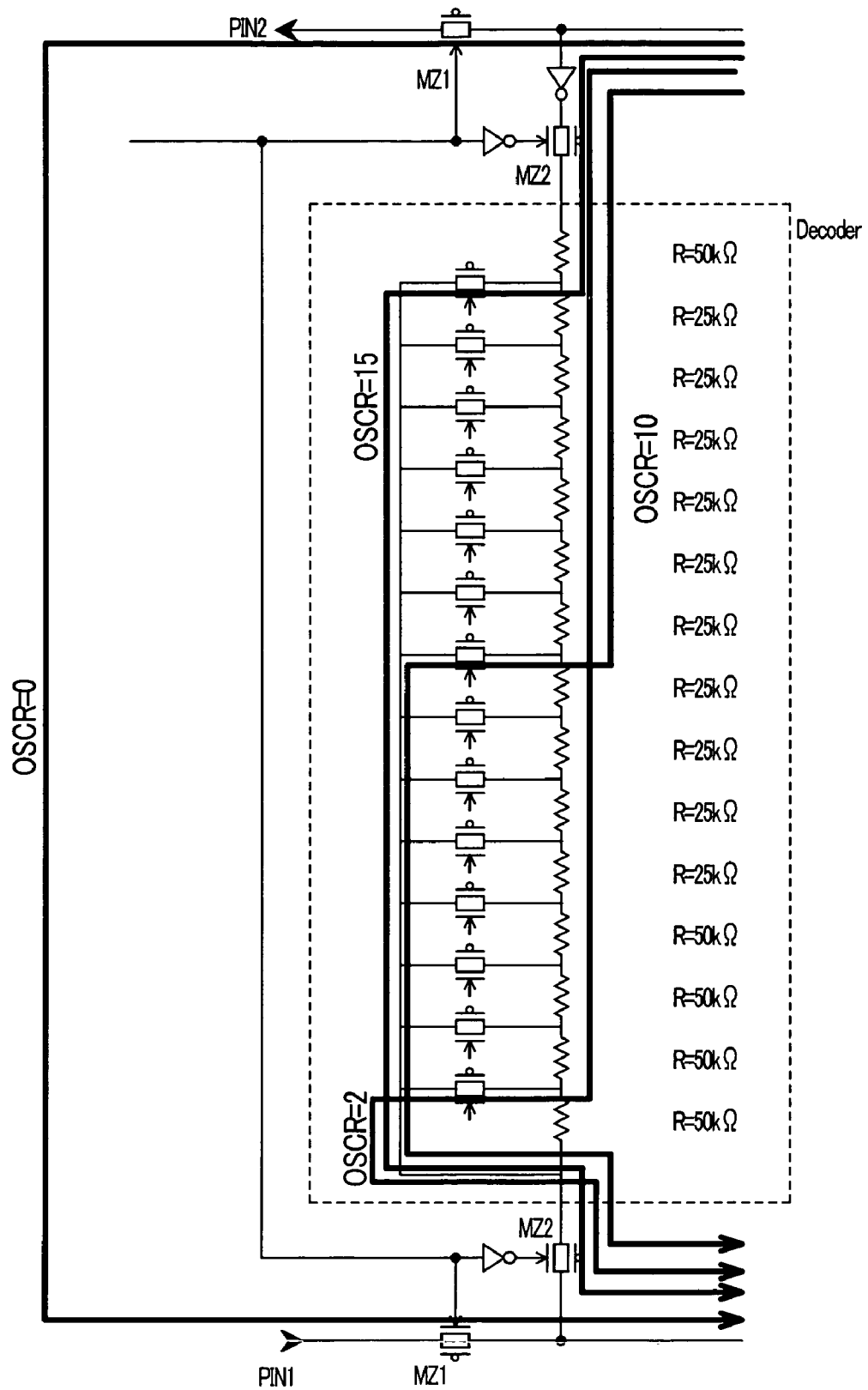
FIG. 24 is a circuit diagram showing the constitution of a resistance array (a R decoder) shown in FIG. 23.

FIG. 24 is a circuit diagram showing the constitution of the resistance array (R Decoder) shown in FIG. 23.

When the exteriorly-mounted resistance element (R) is used, a transfer gate circuit (MZ1) is turned on and a transfer gate circuit (MZ2) is turned off. The current loop of the oscillator 10 at this time is shown by OSCR=0 in FIG. 24.

Further, when the resistance array (R Decoder) is used, the transfer gate circuit (MZ1) is turned off and the transfer gate circuit (MZ2) is turned on.

In the resistance array (R Decoder), a plurality of inner resistances are connected in series and hence, by selecting this inner resistance using one of a group of transfer gate circuits (MZT), the resistance value can be varied.

In FIG. 24, when 450 kΩ is selected as the resistance array (R Decoder), a current loop of the oscillator 10 is shown as OSCR=2. When 175 kΩ is selected as the resistance array (R Decoder), a current loop of the oscillator 10 is shown as OSCR=10. Further, when 50 kΩ is selected as the resistance array (R Decoder), a current loop of the oscillator 10 is shown as OSCR=15.

FIG. 25 is a view for explaining a display timing clock (CL1) which is generated using a display timing generating circuit 11 and a boosting clock which is generated using the oscillator 10.

As shown in FIG. 25(a), the display timing generating circuit 11 generates the display timing clock (CL1) in response to a horizontal synchronizing signal (HSYNC) which is inputted from the DI (RGB interface) and a dot clock (DOTCLK).

This display timing clock (CL1) is a signal having a fixed period (T1 shown in FIG. 25(b)).

Further, a boosting clock generating circuit 20 generates a boosting clock (DCCLK) by dividing a clock (OSC1) which is generated using the oscillator 10.

The period (T2 shown in FIG. 25(b)) of this boosting clock (DCCLK) is variable per one period of the clock (OSC1) which is generated using the oscillator 10.

In the circuit shown in FIG. 25, the display timing clock (CL1) and the boosting clock (DCCLK) are generated in the inside of the same semiconductor chip. However, since the respective reference clocks are not synchronized, the generated clocks are also not synchronized with each other.

Therefore, due to the interference of the display timing clock (CL1) and the boosting clock (DCCLK), there is a case that the deteriorating of the image quality is induced in the image displayed in the liquid crystal display panel (PNL).

FIG. 26 is a view for explaining the display timing clock (CL1) which is generated by the display timing generating circuit 11 and the boosting clock which is generated by the oscillator.

The circuit shown in FIG. 26 is provided for preventing the occurrence of the deterioration of the image quality displayed on the liquid crystal display panel (PNL) which is caused by the interference between the display timing clock (CL1) and the boosting clock (DCCLK).

In the circuit shown in FIG. 26, when the display timing clock (CL1) which is generated by the display timing generating circuit 11 is used as the display control signal, the boosting clock generating circuit 20 generates the boosting clock (DCCLK) based on a dot clock (DOTCLK) which is inputted through a switch (SW).

Due to such a constitution, since the display timing clock (CL1) and the boosting clock (DCCLK) are synchronized, it is possible to prevent the occurrence of the deterioration of the image quality displayed on the liquid crystal display panel (PNL).

In this case, the boosting clock generating circuit 20 generates the boosting clock (DCCLK) in following two modes.

(1) Mode 1

The boosting clock (DCCLK) having the equal period as the display timing clock (CL1) and, at the same time, being capable of varying a Duty ratio which becomes a charge/discharge ratio of the liquid crystal drive power source generating circuit 120 (see T3 shown in FIG. 26B).

(2) Mode 2

The boosting clock (DCCLK) being synchronized with the dot clock (DOTCLK), having a variable period and, at the same time, having a Duty ratio which becomes a charge/discharge ratio of the liquid crystal drive power source generating circuit 120 fixed to 50% (see T4 shown in FIG. 26B).

However, in this mode 2, the boosting clock (DCCLK) is not in synchronism with the display timing clock (CL1). B Here, in the above-mentioned description, the present invention has been explained in conjunction with the embodiments which are applied to the TFT type liquid crystal display module. However, the present invention is not limited to such embodiments and is applicable to a SNT type liquid crystal display module or an EL display device having organic EL elements.

Although the present invention made by inventors of the present invention has been explained specifically in conjunction with the above-mentioned embodiments, it is needless to say that the present invention is not limited to such embodiments and various modifications can be made without departing from the gist of the present invention.

To briefly explain the advantageous effects obtained by the typical inventions among the inventions disclosed in this specification, they are as follows.

That is, according to the present invention, in the display device including the SRAM, it is possible to enhance the low power consumption.

What is claimed is:

1. A display device comprising a drive circuit to which video data is supplied from the outside; video lines to which video signals outputted from the drive circuit are supplied; and pixels to which the video signals are supplied through the video lines, wherein
the drive circuit includes a static random access memory which stores the video data in memory cells, and
each memory cell of the static random access memory includes
a first inverter which has an input terminal thereof connected to a first node and an output terminal thereof connected to a second node,
a second inverter which has an output terminal thereof connected to the first node and an input terminal thereof connected to the second node,
a first-conductive-type first transistor which is connected between a writing data line and the first node and has a control terminal thereof connected to a writing word line,
a second-conductive-type second transistor which is connected between the writing data line and the first node and has a control terminal thereof connected to the writing word line,
a first-conductive-type third transistor which is connected between a reading data line and the second node and has a control terminal thereof connected to a reading word line, and
a second-conductive-type fourth transistor which is connected between the reading data line and the second node and has a control terminal thereof connected to the reading word line,
wherein the drive circuit is configured (1) to perform writing only on selected one or more said memory cells that are connected to shared writing and reading word lines and (2) to drive other ones of said memory cells connected to the shared writing and reading word lines and not selected to perform writing to output video data respectively stored therein to a reading data line and then to rewrite the video data back to said other ones of said memory cells, without precharging said memory cells that are connected to shared writing and reading word lines.

2. A display device according to claim 1, wherein the static random access memory includes a control part,
the control part turns on the first and second transistors at the time of writing the video data, and
the video data stored in the memory cell is supplied to the writing data line.

3. A display device according to claim 1, wherein the control part turns on the third and fourth transistors at the time of reading the video data, and
supplies the video data read from the memory cell to the reading data line.

4. A display device according to claim 3, wherein the static random access memory includes storage means which stores the video data supplied to the reading data line and read from the memory cell, and
the control part, at the time of writing the video data, selects video data inputted from the outside or the data stored in the storage means and supplies the data to the writing data line.

5. A display device according to claim 1, wherein the second inverter is a clocked inverter, and
the clocked inverter is turned off when the first and second transistors are turned on.

6. A display device according to claim 1, wherein the video data stored in the memory is video data for partial display.

7. A display device which includes a drive circuit to which video data is supplied from the outside, video lines to which video signals outputted from the drive circuit are supplied, and pixels to which the video signals are supplied through the video lines, wherein
the drive circuit includes a static random access memory which stores the video data in memory cells, and
a DA converter circuit which is provided between the static random access memory and the video lines, and
each memory cell of the memory includes
a first inverter which has an input terminal thereof connected to a first node and an output terminal thereof connected to a second node,
a second inverter which has an output terminal thereof connected to the first node and an input terminal thereof connected to the second node,
a first-conductive-type first transistor and a second-conductive-type second transistor which are connected between a writing data line and the first node, and
a first-conductive-type third transistor and a second-conductive-type fourth transistor which are connected between a reading data line and the second node, wherein
the first and the second transistors are turned on at the time of writing the video data and are turned off at the time of reading the video data,
the third and the fourth transistors are turned off at the time of writing the video data and are turned on at the time of reading the video data,
wherein the drive circuit is configured (1) to perform writing only on selected one or more said memory cells that are connected to shared writing and reading word lines and (2) to drive other ones of said memory cells connected to the shared writing and reading word lines and not selected to perform writing to output video data respectively stored therein to a reading data line and then to rewrite the video data back to said other ones of sad memory cells, without precharging said memory cells that are connected to shared writing and reading word lines.

8. A display device according to claim 7, wherein the drive circuit includes a first path which supplies the video data to the DA conversion circuit without passing through the static random access memory, and
a second path which supplies the video data to the DA conversion circuit by way of the memory.

9. A display device according to claim 8, wherein the drive circuit includes a gray scale voltage generating part which outputs a plurality of gray scale voltages to the DA conversion circuit, and an operation of a circuit which constitutes a portion of the gray scale voltage generating part is stopped at the time of supplying the video data to the DA conversion circuit through the second path.

10. A display device according to claim 7, wherein the drive circuit assumes a first operative state in which the video data is supplied to the DA conversion circuit without passing through the memory and a second operative state in which the video data is stored in the static random access memory.

11. A display device according to claim 10, wherein the drive circuit includes a gray scale voltage generating part which outputs a plurality of gray scale voltages to the DA conversion circuit, and an operation of a circuit which constitutes a portion of the gray scale voltage generating part is stopped when the drive circuits assumes the second operative state.

12. A display device according to claim 11, wherein the gray scale voltage generating part includes a plurality of amplifying circuits which generate gray scale reference voltages, and the drive circuit stops an operation of the amplifying circuits other than the amplifying circuits which output a maximum gray scale voltage and a minimum gray scale voltage among the plurality of amplifying circuits in the second operative state.

13. A display device according to claim 10, wherein the display device includes an output circuit between the DA conversion circuit and the video line, and stops an operation of the output circuit when the drive circuit assumes the second operative state.

14. A display device according to claim 13, wherein the display device includes a video signal bypass means which, when the operation of the output circuit is stopped in the second operative state, supplies an analogue signal outputted from the DA conversion circuit as the video signal to the video line without through the output circuit.

15. A display device according to claim 13, wherein the display device includes a video signal bypass means which, when the operation of the output circuit is stopped in the second operative state, supplies gray scale voltages of arbitrary two stages to the video line based on arbitrary data inputted to the DA conversion circuit.

16. A display device according to claim 14, wherein an operation of the video signal bypass means is stopped during a period in which the data inputted to the DA conversion circuit is changed.

17. A display device according to claim 14, wherein the display includes a level shift circuit which is provided for every video data in a preceding stage of the DA conversion circuit and, stops an operation of the level shift circuit based on data other than data inputted to the DA conversion circuit when the operation of the output circuit is stopped in the second operative state.

18. A display device according to claim 13, wherein the number of gray scales of the pixels in the second operative state is set smaller than the number of gray scales of the pixels in the first operative state.

19. A display device according to claim 1, wherein a third inverter is provided between a gate of the second-conductive-type second transistor and the writing word line, and a fourth inverter is provided between a gate of the second-conductive-type fourth transistor and the reading word line.

* * * * *